US009355976B2

(12) United States Patent
Kim et al.

(10) Patent No.: US 9,355,976 B2
(45) Date of Patent: May 31, 2016

(54) SEMICONDUCTOR MEMORY CHIPS AND STACK-TYPE SEMICONDUCTOR PACKAGES INCLUDING THE SAME

(71) Applicants: Yonghoon Kim, Suwon-si (KR); Hyo-Soon Kang, Seoul (KR)

(72) Inventors: Yonghoon Kim, Suwon-si (KR); Hyo-Soon Kang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/077,133

(22) Filed: Nov. 11, 2013

(65) Prior Publication Data

US 2014/0138851 A1   May 22, 2014

(30) Foreign Application Priority Data

Nov. 21, 2012   (KR) .................. 10-2012-0132481

(51) Int. Cl.
*H01L 23/48* (2006.01)
*H01L 23/00* (2006.01)
(Continued)

(52) U.S. Cl.
CPC .......... *H01L 24/06* (2013.01); *H01L 23/49816* (2013.01); *H01L 23/5386* (2013.01); *H01L 25/0652* (2013.01); *H01L 25/0655* (2013.01); *H01L 25/0657* (2013.01); *H01L 25/105* (2013.01); *H01L 25/18* (2013.01); *H01L 24/73* (2013.01); *H01L 2224/02166* (2013.01); *H01L 2224/0401* (2013.01); *H01L 2224/04042* (2013.01); *H01L 2224/05554* (2013.01); *H01L 2224/05571* (2013.01); *H01L 2224/06135* (2013.01); *H01L 2224/16225* (2013.01); *H01L 2224/32145* (2013.01); *H01L 2224/32225* (2013.01); *H01L 2224/45139* (2013.01); *H01L 2224/48227* (2013.01); *H01L 2224/73204* (2013.01); *H01L 2224/73265* (2013.01); *H01L 2225/0651* (2013.01); *H01L 2225/06562* (2013.01); *H01L 2225/06568* (2013.01);
(Continued)

(58) Field of Classification Search
CPC ... H01L 24/06; H01L 25/0655; H01L 25/105; H01L 25/0652; H01L 25/18; H01L 25/0657
See application file for complete search history.

(56) References Cited

U.S. PATENT DOCUMENTS 7,286,386 B2   10/2007   Miwa et al.
7,348,668 B2   3/2008   Masuda et al.
(Continued)

FOREIGN PATENT DOCUMENTS

JP   07086526   3/1995
JP   3162885 B2   5/2001
(Continued)

*Primary Examiner* — A. Sefer
(74) *Attorney, Agent, or Firm* — Renaissance IP Law Group LLP

(57) ABSTRACT

Provided are semiconductor memory chips and semiconductor packages with the same. The semiconductor package may include a memory chip including first data pads and first command/address pads arranged adjacent to a first side region thereof and second data pads and second command/address pads arranged adjacent to a second side region thereof arranged opposite to the first side region, and a package substrate including first CA connection pads and second CA connection pads. The memory chip may be mounted on a top surface of the package substrate, the first CA connection pads may be connected to the first command/address pads, and the second CA connection pads may be provide to be opposite to the first CA connection pads and be connected to the second command/address pads.

14 Claims, 28 Drawing Sheets

(51) Int. Cl.
    *H01L 25/065*     (2006.01)
    *H01L 25/10*     (2006.01)
    *H01L 25/18*     (2006.01)
    *H01L 23/498*     (2006.01)
    *H01L 23/538*     (2006.01)

(52) U.S. Cl.
    CPC . *H01L2225/1023* (2013.01); *H01L 2225/1058* (2013.01); *H01L 2924/00014* (2013.01); *H01L 2924/1434* (2013.01); *H01L 2924/15192* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 7,700,409 B2 * | 4/2010 | Jensen | ............... H01L 25/0657 257/686 |
| 7,944,036 B2 | 5/2011 | Sasaki | |
| 8,115,324 B2 | 2/2012 | Kang et al. | |
| 2004/0145042 A1 | 7/2004 | Morita et al. | |
| 2006/0170084 A1 | 8/2006 | Masuda et al. | |
| 2006/0180943 A1 | 8/2006 | Miwa et al. | |
| 2008/0012107 A1 * | 1/2008 | Isa | ................... H01L 23/49838 257/678 |
| 2008/0230888 A1 | 9/2008 | Sasaki | |
| 2009/0127717 A1 | 5/2009 | Kang et al. | |
| 2010/0208443 A1 * | 8/2010 | Itaya et al. | .................... 361/783 |
| 2011/0025699 A1 | 2/2011 | Ogawa | |
| 2012/0261837 A1 * | 10/2012 | Inoue et al. | .................... 257/777 |
| 2012/0273970 A1 * | 11/2012 | Kuroda | ........................ 257/777 |
| 2014/0001653 A1 * | 1/2014 | Kwon et al. | ................... 257/777 |

FOREIGN PATENT DOCUMENTS

| | | |
|---|---|---|
| JP | 2001167594 A | 6/2001 |
| JP | 2011222807 A | 11/2011 |
| KR | 2002-0071618 | * 9/2002 |

\* cited by examiner

SEMICONDUCTOR MEMORY CHIPS AND STACK-TYPE SEMICONDUCTOR PACKAGES INCLUDING THE SAME

CROSS-REFERENCE TO RELATED APPLICATIONS

This U.S. non-provisional patent application claims priority under 35 U.S.C. §119 to Korean Patent Application No. 10-2012-0132481, filed on Nov. 21, 2012, in the Korean Intellectual Property Office, the entire contents of which are hereby incorporated by reference.

BACKGROUND

Example embodiments of the inventive concept relate to semiconductor memory chips and stack-type semiconductor packages including the same, and in particular, to semiconductor memory chips provided with a pad structure capable of improving routability and package property, and stack-type semiconductor packages including the same.

Recently, demands for a single system having a plurality of processors or a multicore processor system are increasing in order to provide more efficient performance of portable electronic applications, such as a portable multimedia player (PMP), a mobile phone, a smart phone, a global positioning system (GPS), a navigation system, a digital camera, a digital video camera, or a personal digital assistant (PDA). For example, in addition to its basic function as a telephone, there is an increasing demand for mobile phones to provide additional functions, such as the playing music and movies, operation as a game console, picture-taking, or providing mobile payment solutions. Accordingly, it may be desirable to integrate not only a communication processor to perform communication modulation and demodulation, but also a media processor to perform application functions, other than the communication function, on a printed circuit board in a mobile phone. This may be achieved by stacking a plurality of semiconductor chips in a package or stacking one package on another package. For example, in a package-on-package (PoP) structure, one of the stacked packages may include a plurality of semiconductor chips. In this case, since the plurality of semiconductor chips are typically electrically connected to each other within one package, a wiring structure of the device may become undesirably complicated, which results in decreased routability.

SUMMARY

Example embodiments of the inventive concept provide semiconductor memory chips provided with a pad structure capable of improving routability and package property.

Other example embodiments of the inventive concept provide stack-type semiconductor packages provided with a pad structure capable of improving routability and package property.

According to example embodiments of the inventive concepts, a semiconductor package may include a memory chip including first data pads and first command/address pads arranged adjacent to a first side region thereof and second data pads and second command/address pads arranged adjacent to a second side region thereof being opposite to the first side region, and a package substrate including first CA connection pads and second CA connection pads. The memory chip may be mounted on a top surface of the package substrate, the first CA connection pads may be connected to the first command/address pads, and the second CA connection pads may be arranged opposite to the first CA connection pads and be connected to the second command/address pads.

According to example embodiments of the inventive concepts, provided is a semiconductor package including first and second memory chips mounted on a top surface of a package substrate. Each of the first and second memory chips may include first data pads and first command/address pads arranged adjacent to a first side region thereof and second data pads and second command/address pads arranged adjacent to a second side region thereof being opposite to the first side region. The package substrate may have a first edge that is parallel to the first side regions of the first and second memory chips. In addition, the package substrate may include first CA connection pads, which are connected to the first command/address pads of the first and second memory chips, and second CA connection pads, which are connected to the second command/address pads of the first and second memory chips to be opposite to the first CA connection pads.

According to example embodiments of the inventive concepts, a semiconductor package may include a lower package including a logic chip mounted on a lower package substrate, an upper package including a memory chip mounted on an upper package substrate and electrically connected to the logic chip, the upper package substrate being stacked on the lower package, and connection terminals provided between the lower package substrate and the upper package substrate to connect the lower package electrically to the upper package. Each of the memory and logic chips may include first data pads and first command/address pads arranged adjacent to a first side region thereof, and second data pads and second command/address pads arranged adjacent to a second side region thereof being opposite to the first side region, and the memory chip may be partially overlapped with the logic chip, in plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
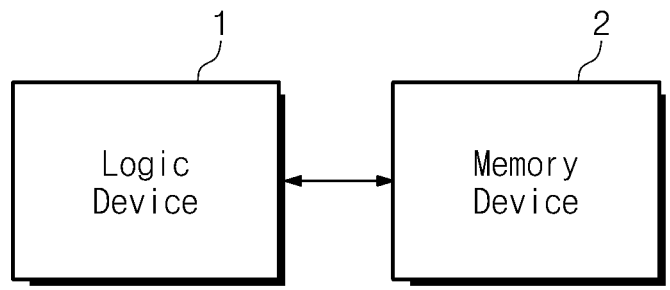
FIGS. 1 and 2 are schematic block diagrams illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
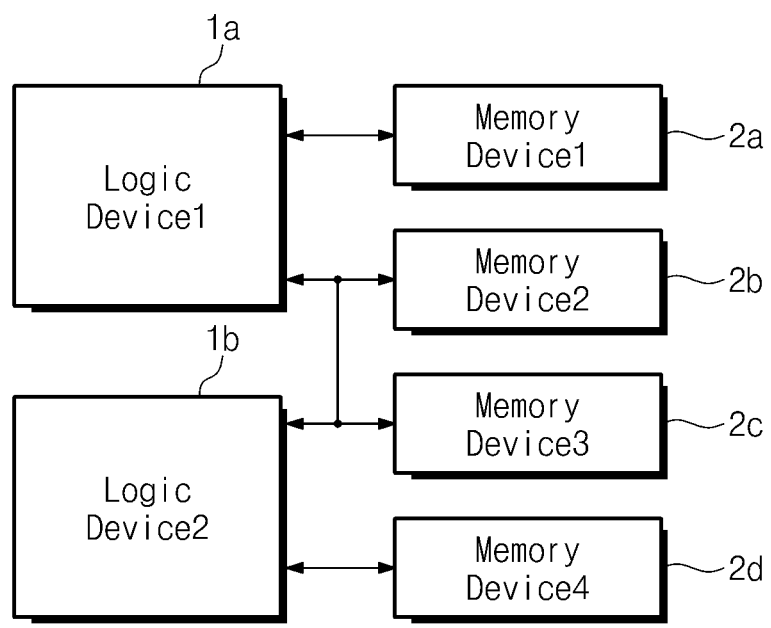

FIGS. 1 and 2 are schematic block diagrams illustrating a semiconductor package according to example embodiments of the inventive concept.

Referring to FIGS. 1 and 2, a semiconductor package may include at least one logic device 1 and at least one memory device 2. In example embodiments, the logic devices 1 and the memory devices 2 may be individually-packaged semiconductor chips.

A logic device may be any electronic device, other than a memory device, containing logic circuitry. The logic devices 1 may be, for example, a photoelectron device, a communication device, a digital signal processor (DSP), a general purpose processor including a microprocessor, microcontroller, a combination of DSP and a microprocessor, an application specific integrated circuit (ASIC), or a system-on-chip. The memory devices 2 may be one of, for example, DDR2 DRAM, DDR3 DRAM, mobile DRAM, EDP, PRAM, One-DRAM, Pseudo SRAM, LpDDR DRAM, FRAM, Graphic DRAM, or ReRAM. Alternatively, the memory devices 2 may be one of NAND flash, NOR flash, OneNAND, PRAM, spin transfer torque (STT)-RAM, or ReRAM.

Referring to FIG. 2, a semiconductor package may include first and second logic devices 1*a* and 1*b* and first to fourth memory devices 2*a*, 2*b*, 2*c*, and 2*d*. In example embodiments, the first logic device 1*a* may be a digital baseband modem processor and/or an analog baseband modem processor, and the second logic device 2*b* may be a media processor, which may be configured to process communication data or entertainment data (e.g., game data). The first to fourth memory devices 2*a*, 2*b*, 2*c*, and 2*d* may be configured to have the same operational property or different operational properties from one another. For example, the first and fourth memory devices 2*a* and 2*d* may be DRAM devices, while the second and third memory devices 2*b* and 2*c* may be FLASH memory devices.

The logic devices 1, 1*a*, and 1*b* and the memory devices 2 and 2*a*-2*d* may be connected to each other by bus channels. The bus channels may be configured to transmit command/address signals and data signals to the memory devices 2 and 2*a*-2*d*. In some embodiments, each bus channel may be configured to interface data signals of 16 bits or 32 bits.

The semiconductor package according to example embodiments of the inventive concept may be mounted on portable devices, such as a mobile phone, a smart phone, a personal digital assistant (PDA), a portable multimedia player (PMP), a digital multimedia broadcast (DMB) device, a global positioning system (GPS) device, or a handled gaming console.

In the semiconductor package according to some example embodiments of the inventive concept, the memory devices 2 may be packaged in the form of a semiconductor memory chip, in which data pins are separated from command/address pins. For example, the data pins may be arranged on a first side region, while the command/address pins may be arranged on a second side region located opposite to the first side region.

Since large data processing capacity and high performance are required for logic devices 1, there may be an increased number of I/O pins of each logic device 1 which are different from those of memory chips. Accordingly, there may be complexity in an interconnection structure between the memory and logic chips, when the memory and logic chips are mounted in a single semiconductor package. In other words, it may be desirable to simplify the interconnection structure between the memory and logic chips in the semiconductor packages.

FIGS. 3 through 6 are plan views illustrating semiconductor memory chips according to various embodiments of the inventive concept.

Referring to FIGS. 3 through 6, a semiconductor memory chip 10 may include data pads PD1-PD4, which may be used to input and output data signals, command/address pads PC1 and PC2, which may be used to input and output command and address signals (such as data strobe signals DQS, data mask signals DQM, chip selection signals CS, clock signal CLK, write enable signals WE, RAS signals, and CAS signals), and power and ground pads (not shown) to be applied with power and ground voltages.

In example embodiments, the semiconductor memory chip 10 may include a first side region S1 and a second side region S2 arranged opposite to each other, with data pads and command/address pads arranged on each of the first and second side regions S1 and S2. In example embodiments, the semiconductor memory chip 10 may be a 32 or 64 bit mobile DRAM device.

Figure 3:
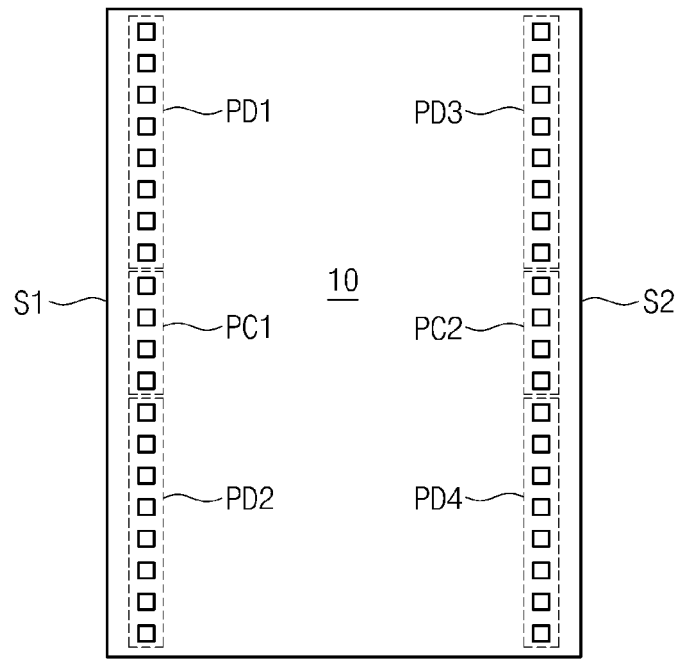
FIGS. 3 through 6 are plan views illustrating semiconductor memory chips according to various embodiments of the inventive concept.

According to the embodiment shown in FIG. 3, the semiconductor memory chip 10 may include first to fourth data pads PD1-PD4 and first and second command/address pads PC1 and PC2.

The first and second data pads PD1 and PD2 and the first command/address pads PC1 may be provided adjacent to the first side region S1 of the semiconductor memory chip 10, while the third and fourth data pads PD3 and PD4 and the second command/address pads PC2 may be provided adjacent to the second side region S2 of the semiconductor memory chip 10. In the first side region S1, the first command/address pads PC1 may be provided between the first and second data pads PD1 and PD2. In the second side region S2, the second command/address pads PC2 may be provided between the third and fourth data pads PD3 and PD4.

In the semiconductor memory chip 10 shown in FIG. 3, the first data pads PD1 may receive first data signals (DATA[7:0]) from a logic chip, while the second data pads PD1 may receive second data signals (DATA[15:8]) from the logic chip. The third data pads PD3 may receive third data signals (DATA[23:16]) from the logic chip, while the fourth data pads PD4 may receive fourth data signals (DATA[31:24]) from the logic chip. In addition, first and second command/address pads PC1 and PC2 may receive command and address signals (such as data strobe signals DQS, data mask signals DQM, chip selection signals CS, clock signal CLK, write enable signals WE, RAS signals, and CAS signals) from the logic chip.

Figure 4:
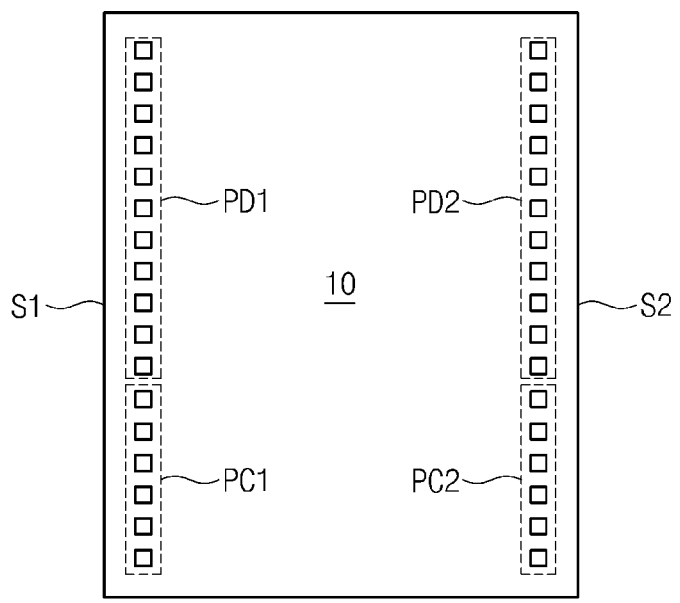
Figure 5:
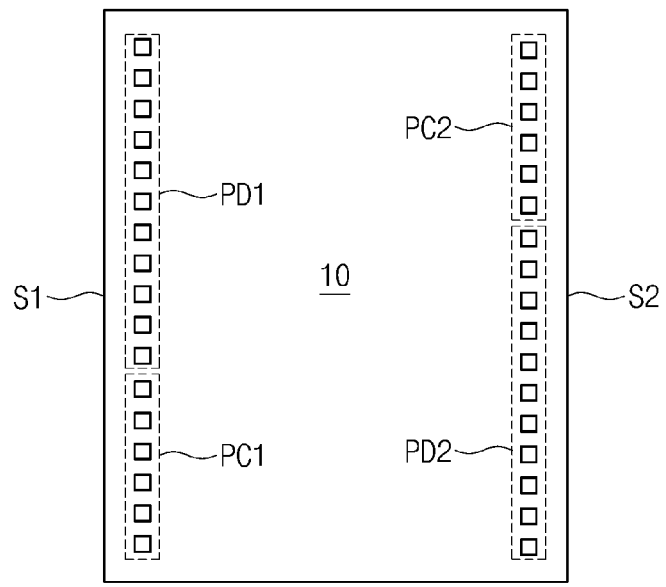

According to the embodiment shown in FIGS. 4 and 5, the semiconductor memory chip 10 may include first and second data pads PD1 and PD2 and first and second command/address pads PC1 and PC2.

Referring to FIGS. 4 and 5, the first data pads PD1 and the first command/address pads PC1 may be arranged adjacent to the first side region S1 of the semiconductor memory chip 10, and the second data pads PD2 and the second command/address pads PC2 may be disposed adjacent to the second side region S2 of the semiconductor memory chip 10. For example, as shown in FIG. 4, the first and second data pads PD1 and PD2 may be arranged opposite to each other, and the first and second command/address pads PC1 and PC2 may be arranged opposite to each other. Alternatively, as shown in FIG. 5, the first data pads PD1 and the first command/address pads PC2 may be arranged opposite to each other, and the second data pads PD2 and the second command/address pads PC1 may be arranged opposite to each other.

Figure 6:
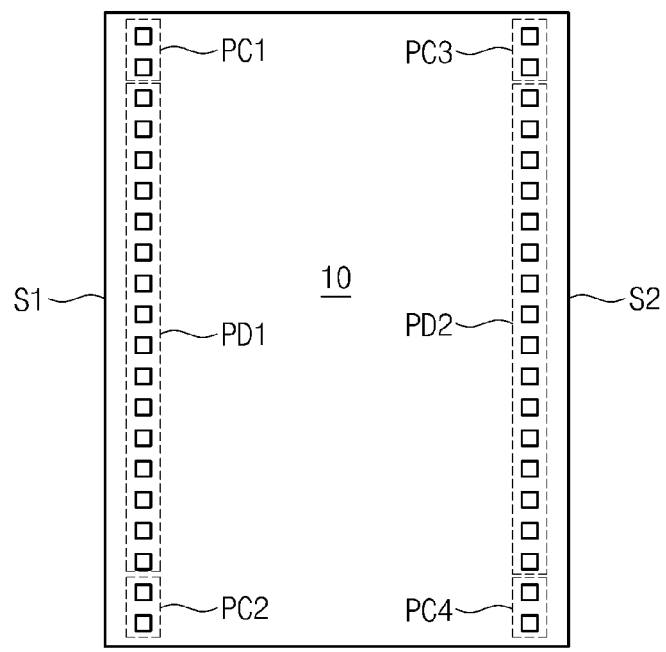

According to the embodiment shown in FIG. 6, the semiconductor memory chip 10 may include first and second data pads PD1 and PD2 and first to fourth command/address pads PC1, PC2, PC3, and PC4. In the present embodiment, the first data pads PD1 and the first and second command/address pads PC1 and PC2 may be arranged adjacent to the first side region S1 of the semiconductor memory chip 10, and the first data pads PD1 may be arranged between the first and second command/address pads PC1 and PC2. The second data pads PD2 and the third and fourth command/address pads PC3 and PC4 may be arranged adjacent to the second side region S2 of the semiconductor memory chip 10, and the second data pads PD2 may be arranged between the third and fourth command/address pads PC3 and PC4.

According to example embodiments, in the semiconductor memory chip 10 shown in FIGS. 4 through 6, the first data pads PD1 may receive first data signals (DATA[15:0]) from the logic chip, and the second data pads PD2 may receive second data signals (DATA[31:16]) from the logic chip. Alternatively, in the semiconductor memory chip 10 shown in FIGS. 4 and 5, the first data pads PD1 may receive first data signals (DATA[7:0]) from the logic chip, and the second data pads PD2 may receive second data signals (DATA[15:8]) from the logic chip. In addition, the first and second command/address pads PC1 and PC2 may receive command and address signals (such as data strobe signals DQS, data mask signals DQM, chip selection signals CS, clock signal CLK, write enable signals WE, RAS signals, and CAS signals) from the logic chip.

Figure 7:
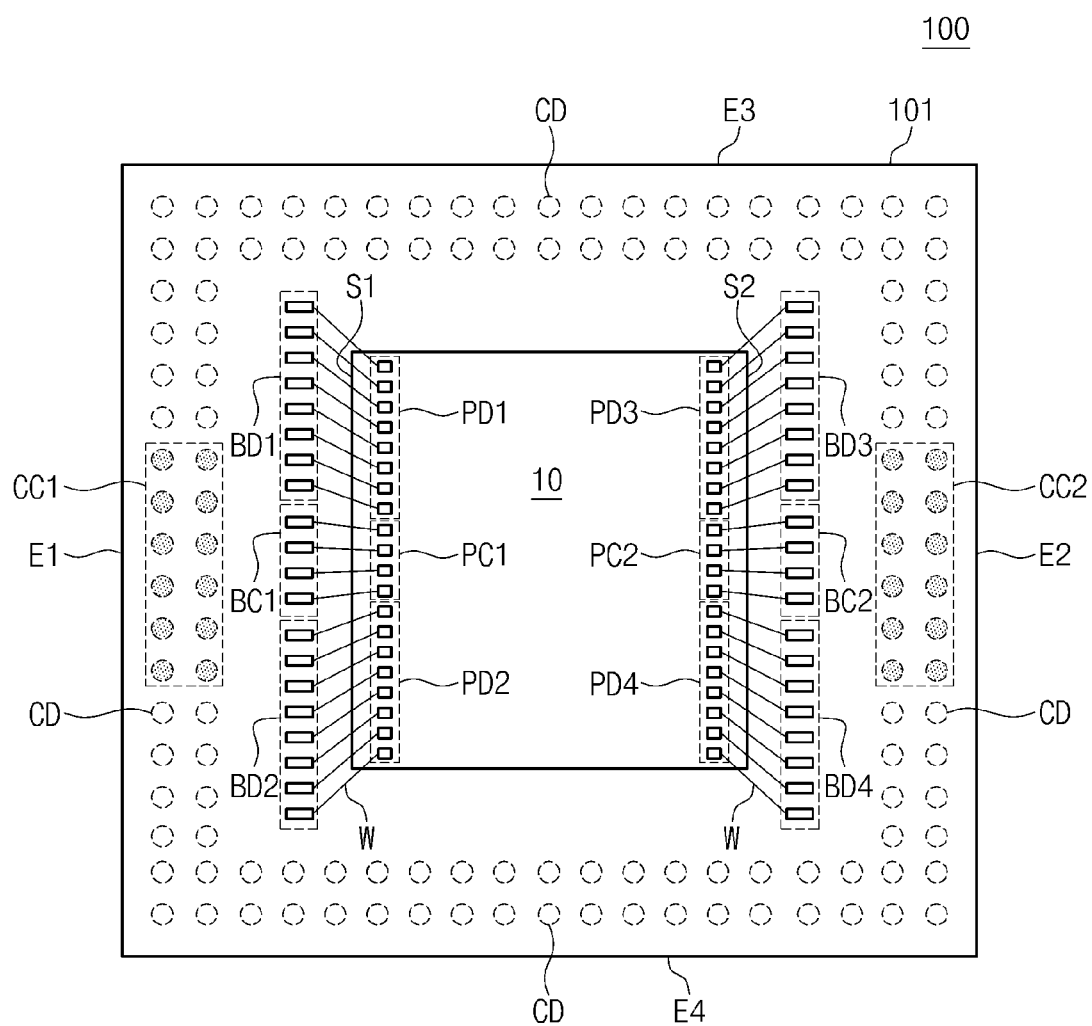
FIG. 7 is a plan view illustrating a first package according to example embodiments of the inventive concept.
Figure 8:
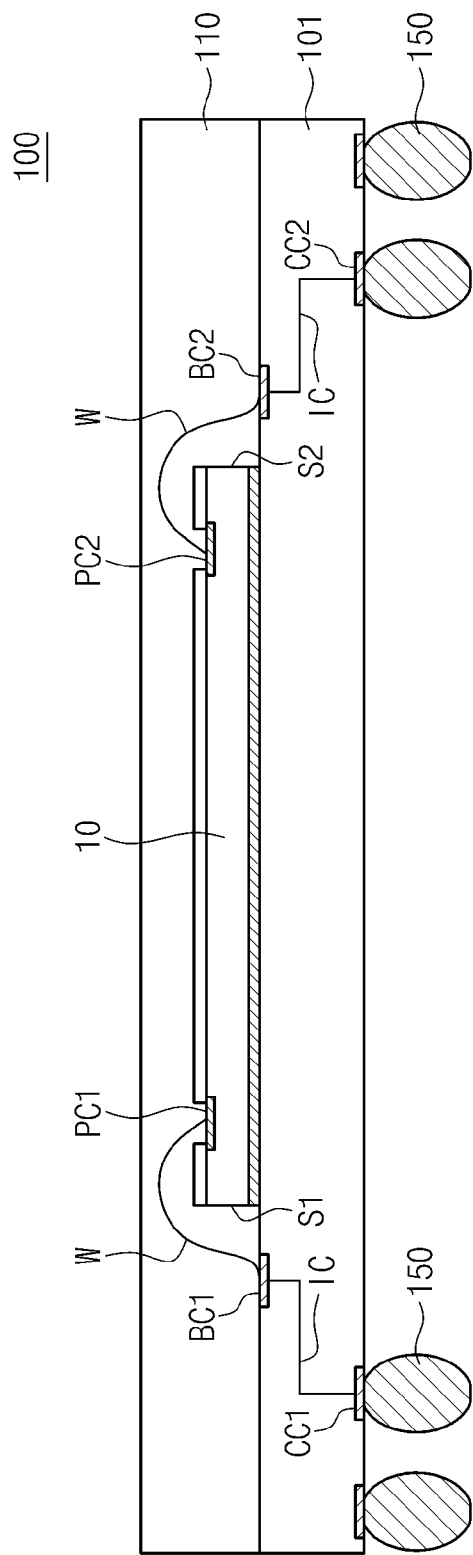
FIG. 8 is a cross-sectional view illustrating the first package according to example embodiments of the inventive concept.

FIG. 7 is a plan view illustrating a first package according to example embodiments of the inventive concept. FIG. 8 is a cross-sectional view illustrating the first package according to example embodiments of the inventive concept.

Referring to FIGS. 7 and 8, a first package 100 may include a semiconductor memory chip 10 mounted on a first package substrate 101. As described with reference to FIGS. 3 through 6, the semiconductor memory chip 10 may include the data pads PD1-PD4 and the command/address pads PC1 and PC2 provided on each of the first and second side regions S1 and S2 arranged opposite to each other.

A mold layer 110 may cover the semiconductor memory chip 10. The mold layer 110 may be provided between the first package substrate 101 and the semiconductor memory chip 10 to fill a space therebetween. The mold layer 110 may include an epoxy molding compound or other suitable encapsulant materials. For example, a ceramic casing may be used to cover the semiconductor memory chip 10.

The first package substrate 101 may be formed using one of various substrates, such as a printed circuit board, a flexible substrate, or a tape substrate. For example, the first package substrate 101 may be one of a flexible printed circuit board, a rigid printed circuit board, or combinations thereof, in which internal wires IC are provided.

The first package substrate 101 may include first to fourth edges E1, E2, E3, and E4, where the first and second edges E1 and E2 may be arranged opposite to each other and the third and fourth edges E3 and E4 may be arranged opposite to each other. The first package substrate 101 may include a top surface and a bottom surface. The first package substrate 101 also includes bonding pads BD1, BD2, BD3, BD4, BC1, and BC2, internal wires IC, and outer connection pads CD, CC1, and CC2.

The bonding pads BD1-BD4, BC1, and BC2 may be arranged on the top surface of the first package substrate 101, and the outer connection pads CD, CC1, and CC2 may be arranged on the bottom surface of the first package substrate 101. The bonding pads BD1-BD4, BC1, and BC2 may be electrically connected to the outer connection pads CD, CC1, and CC2 through the internal wires IC. Outer connection terminals 150, such as solder balls or solder bumps, may be attached to the outer connection pads CD, CC1, and CC2.

In some embodiments, the bonding pads may include the DQ bonding pads BD1-BD4, which may be connected to the data pads of the memory chip 10 through, for example, wires W, and the CA bonding pads BC1 and BC2, which may be connected to the command/address pads PC1 and PC2 of the memory chip 10 through, for example, the wires W. The DQ bonding pads BD1 and BD2, connected to the first and second data pads PD1 and PD2, may be arranged adjacent to the first side region S1 of the semiconductor memory chip 10. The CA bonding pads BC1, connected to the first command/address pads PC1, may be provided between the DQ bonding pads BD1 and BD2. The DQ bonding pads BD3 and BD4, which may be connected to the third and fourth data pads PD3 and PD4, may be arranged adjacent to the second side region S2 of the semiconductor memory chip 10. The CA bonding pads BC2, connected to the second command/address pads PC2, may be provided between the DQ bonding pads BD3 and BD4.

The outer connection pads may include the DQ connection pads CD, which may be connected to the DQ bonding pads BD1, BD2, BD3, and BD4 through the internal wire IC, and the CA connection pads CC1 and CC2, which may be connected to the CA bonding pads BC1 and BC2 through the internal wire IC. The DQ connection pads CD and the CA connection pads CC1 and CC2 may be arranged adjacent to the first and second edges E1 and E2 of the first package substrate 101. In each of the first and second edges E1 and E2, the CA connection pads CC1 and CC2 may be arranged between the DQ connection pads CD. In addition, the DQ connection pads CD may be arranged adjacent to the third and fourth edges E3 and E4 of the first package substrate 101.

The CA connection pads CC1 and CC2 may be provided at positions most adjacent to the CA bonding pads BC1 and BC2 connected to the command/access pads PC1 and PC2 of the semiconductor memory chip 10. This reduces a signal delivery distance, decreasing a signal delay and interference between signals. Accordingly, the semiconductor package can have an improved signal processing speed.

The outer connection terminals 150 may be attached to the DQ connection pads CD and the CA connection pads CC1 and CC2. The DQ connection pads CD and the CA connection pads CC1 and CC2 may be connected to the logic chip through the outer connection terminals 150 to transmit electrical signals (e.g., data and control signals) from the logic chip to the semiconductor memory chip 10.

Figure 9:
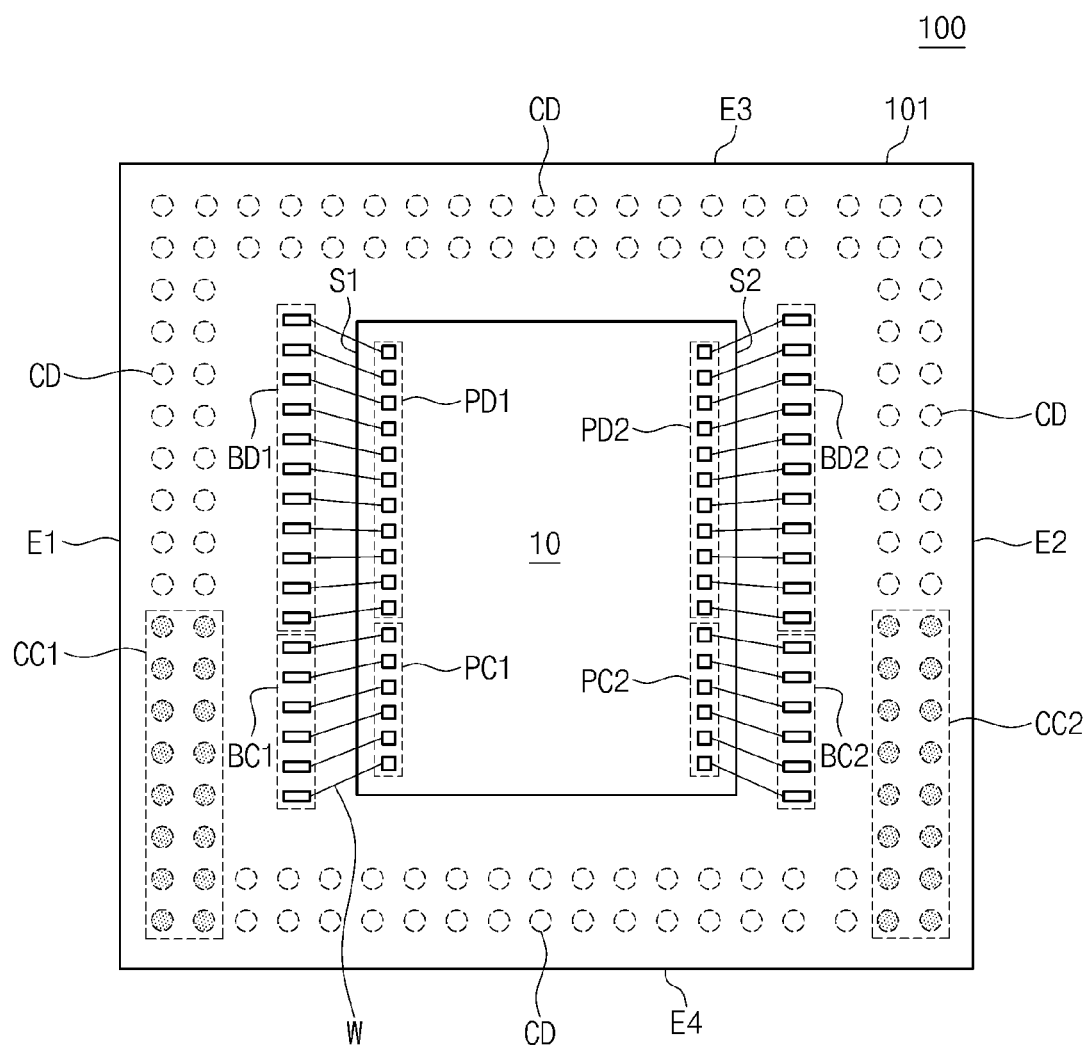
FIG. 9 is a plan view illustrating a first package according to other example embodiments of the inventive concept.

FIG. 9 is a plan view illustrating a first package according to other example embodiments of the inventive concept.

Referring to FIG. 9, the semiconductor memory chip 10 may be mounted on the first package substrate 101 including the first to fourth edges E1-E4. In example embodiments, as described with reference to FIG. 4, the semiconductor memory chip 10 may include the first data pads PD1 and the first command/address pads PC1 provided adjacent to the first side region S1 and include the second data pads PD2 and the second command/address pads PC2 provided adjacent to the second side region S2. In example embodiments, the first data pads PD1 and the second data pads PD2 may be arranged opposite to each other. In other example embodiments, as described with reference to FIG. 5, the first data pads PD1 and the second command/address pads PC2 may be arranged opposite to each other.

The bonding pads BD1, BD2, BC1, and BC2 may be provided on the top surface of the first package substrate 101, and the outer connection pads CD, CC1, and CC2 may be provided on the bottom surface. For example, the DQ bonding pads BD1 and the CA bonding pads BC1, which may be connected to the first data pads PD1 and the first command/address pads PC1, respectively, may be disposed adjacent to the first side region S1 of the semiconductor memory chip 10. The DQ bonding pads BD2 and the CA bonding pads BC2, which may be connected to the second data pads PD2 and the second command/address pads PC2, respectively, may be disposed adjacent to the second side region S2 of the semiconductor memory chip 10. The data pads PD1 and PD2 and the DQ bonding pads BD1 and BD2 of the memory chip 10 may be connected to each other by, for example, the wires W. Similarly, the command/address pads PC1 and PC2 and CA bonding pads BC1 and BC2 of the memory chip 10 may be connected to each other by the wires W.

On the bottom surface of the first package substrate 101, the DQ connection pads CD indicated as a dotted line may be provided at positions closely or directly adjacent to the DQ bonding pads BD1 and BD2, and the CA connection pads CC1 and CC2 may be provided at positions closely or directly adjacent to the CA bonding pads BC1 and BC2. For example, the DQ connection pads CD and the CA connection pads CC1 and CC2 may be arranged adjacent to the first and second edges E1 and E2, respectively, of the first package substrate 101. The CA connection pads CC1 and CC2 may be provided opposite to each other. In addition, the DQ connection pads CD may also be arranged near the third and fourth edges E3 and E4 of the first package substrate 101.

Figure 10:
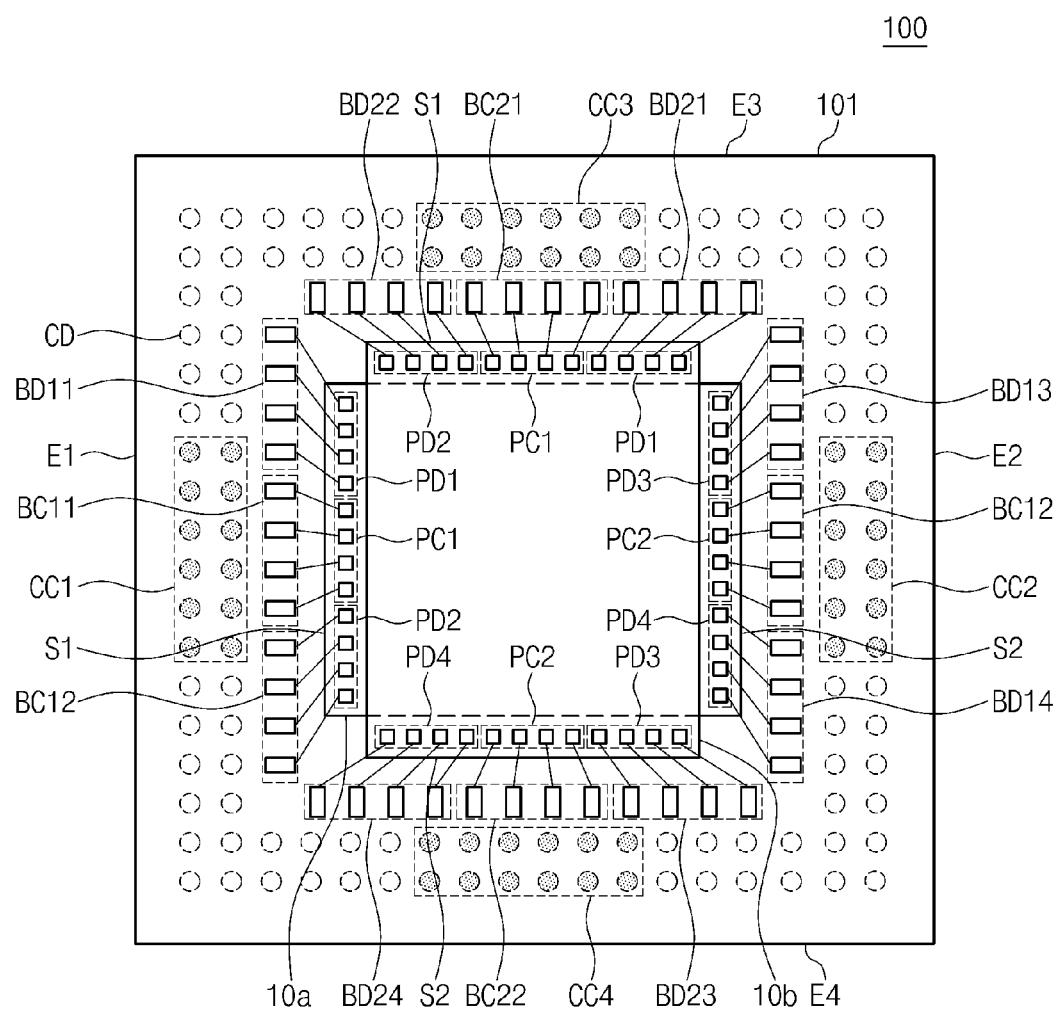
FIG. 10 is a plan view illustrating a first package according to still other example embodiments of the inventive concept.
Figure 11:
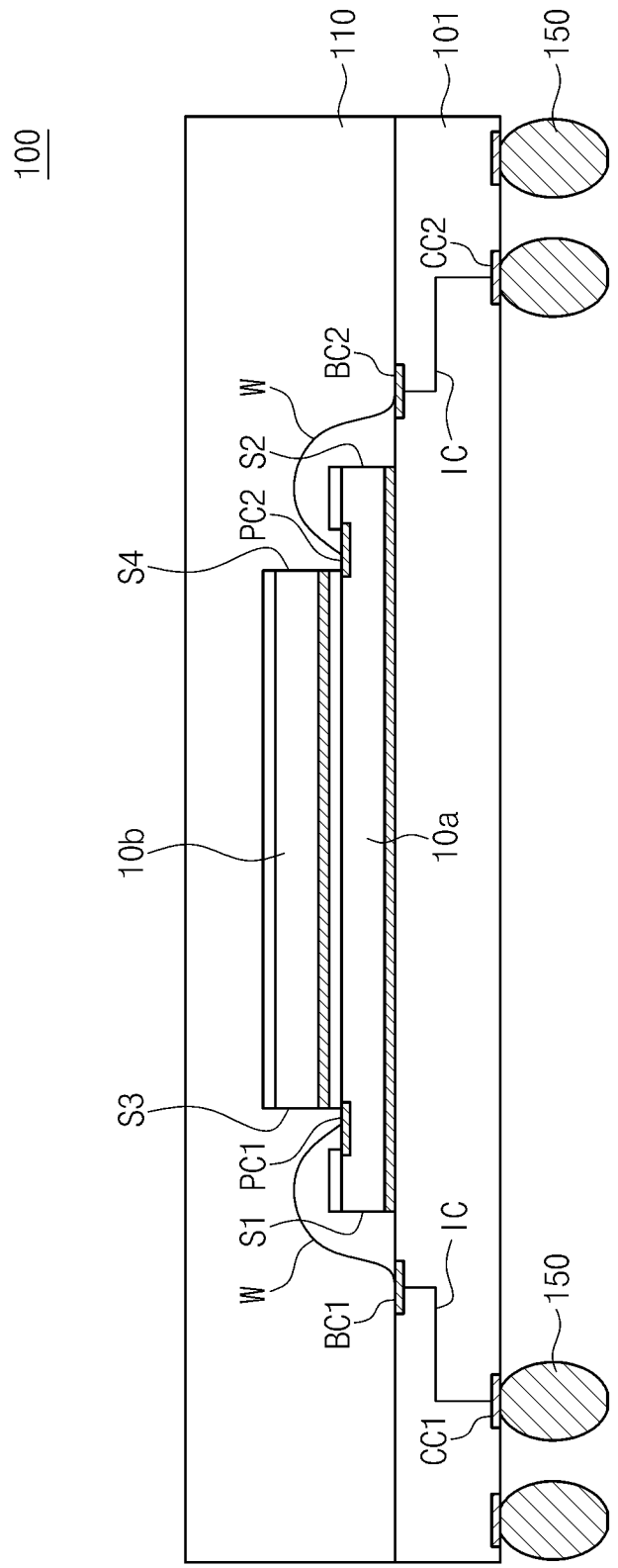
FIG. 11 is a cross-sectional view illustrating the first package according to still other example embodiments of the inventive concept.

FIG. 10 is a plan view illustrating a first package according to still other example embodiments of the inventive concept. FIG. 11 is a cross-sectional view illustrating the first package according to still other example embodiments of the inventive concept.

Referring to FIGS. 10 and 11, a plurality of memory chips 10a and 10b may be stacked on the first package substrate 101 having the first to fourth edges E1-E4.

For example, the first memory chip 10a may be mounted on the first package substrate 101, and the second memory chip 10b may be stacked on the first memory chip 10a. The second memory chip 10b may be attached to the first memory chip 10a, for example, by an adhesive layer. The adhesive layer may be an insulating film (e.g., of epoxy or silicone) or an adhesive tape.

The second memory chip 10b may be rotated 90 degrees with respect to the first memory chip 10a. For example, the first memory chip 10a may be provided in such a way that the first and second side regions S1 and S2 thereof are substantially parallel to the first and second edges E1 and E2, respectively, of the first package substrate 101, and the second memory chip 10b may be provided in such a way that the first and second side regions S1' and S2' thereof are substantially parallel to the third and fourth edges E3 and E4, respectively, of the first package substrate 101.

The first and second memory chips 10a and 10b may be configured to have the same arrangement of the data pads PD1-PD4 and the command/address pads PC1 and PC2 as each other. In example embodiments, each of the first and second memory chips 10a and 10b may include the first and second data pads PD1 and PD2 disposed adjacent to the first side region S1, the first command/address pads PC1 provided between the first and second data pads PD1 and PD2, the third and fourth data pads PD3 and PD4 disposed adjacent to the second side region S2, and the second command/address pads PC2 provided between the third and fourth data pads PD3 and PD4.

In example embodiments, first DQ bonding pads (or bond fingers) BD11, BD12, BD13, and BD14 may be provided on the top surface of the first package substrate 101 to be connected to the data pads of the first memory chip 10a, and first CA bonding pads (bond fingers) BC11 and BC12 may be provided on the top surface of the first package substrate 101 to be connected to the command/address pads of the first memory chip 10a. In addition, second DQ bonding pads (or bond fingers) BD21, BD22, BD23, and BD24 may be provided on the top surface of the first package substrate 101 to be connected to the data pads of the second memory chip 10b, and second CA bonding pads (or bond fingers) BC21 and BC22 may be provided on the top surface of the first package substrate 101 to be connected to the command/address pads of the second memory chip 10b. The first DQ bonding pads BD11, BD12, BD13, and BD14 and the first CA bonding pads BC11 and BC12 may be arranged adjacent to the first and second edges E1 and E2 of the first package substrate 101, and the second DQ bonding pads BD21, BD22, BD23, and BD24 and the second CA bonding pads BC21 and BC22 may be arranged adjacent to the third and fourth edges E3 and E4 of the first package substrate 101. Furthermore, the first CA bonding pads BC11 and BC12 may be disposed between the first DQ bonding pads BD11, BD12, BD13, and BD14, and the second CA bonding pads BC21 and BC22 may be disposed between the second DQ bonding pads BD21, BD22, BD23, and BD24. The bonding pads of the first package substrate 101 and the I/O pads of the first and second memory chips 10a and 10b may be electrically connected to each other by the wires W.

On the bottom surface of the first package substrate 101, the DQ connection pads CD may be provided at positions closely or directly adjacent to the first and second DQ bonding pads BD11, BD12, BD13, BD14, BD21, BD22, BD23, and BD24, and the CA connection pads CC1, CC2, CC3, and CC4 may be provided at positions closely or directly adjacent to the first and second CA bonding pads BC11, BC12, BC21, and BC22. Further, the CA connection pads CC1, CC2, CC3, and CC4 may be arranged adjacent to the first to fourth edges E1-E4, respectively, of the first package substrate 101. For example, not only the DQ connection pads CD but also the CA connection pads CC1, CC2, CC3, and CC4 may be arranged adjacent to the first to fourth edges E1-E4, respectively, of the first package substrate 101.

The DQ connection pads CD may be connected to the first DQ bonding pads BD11, BD12, BD13, and BD14 and the second DQ bonding pads BD21, BD22, BD23, and BD24 through the internal wire IC. The CA connection pads CC1 and CC2 adjacent to the first and second edges E1 and E2 may be connected to the first CA bonding pads BC11 and BC12 through the internal wire IC. The CA connection pads CC3 and CC4 adjacent to the third and fourth edges E3 and E4 may be connected to the second CA bonding pads BC21 and BC22 through the internal wire IC.

Figure 12:
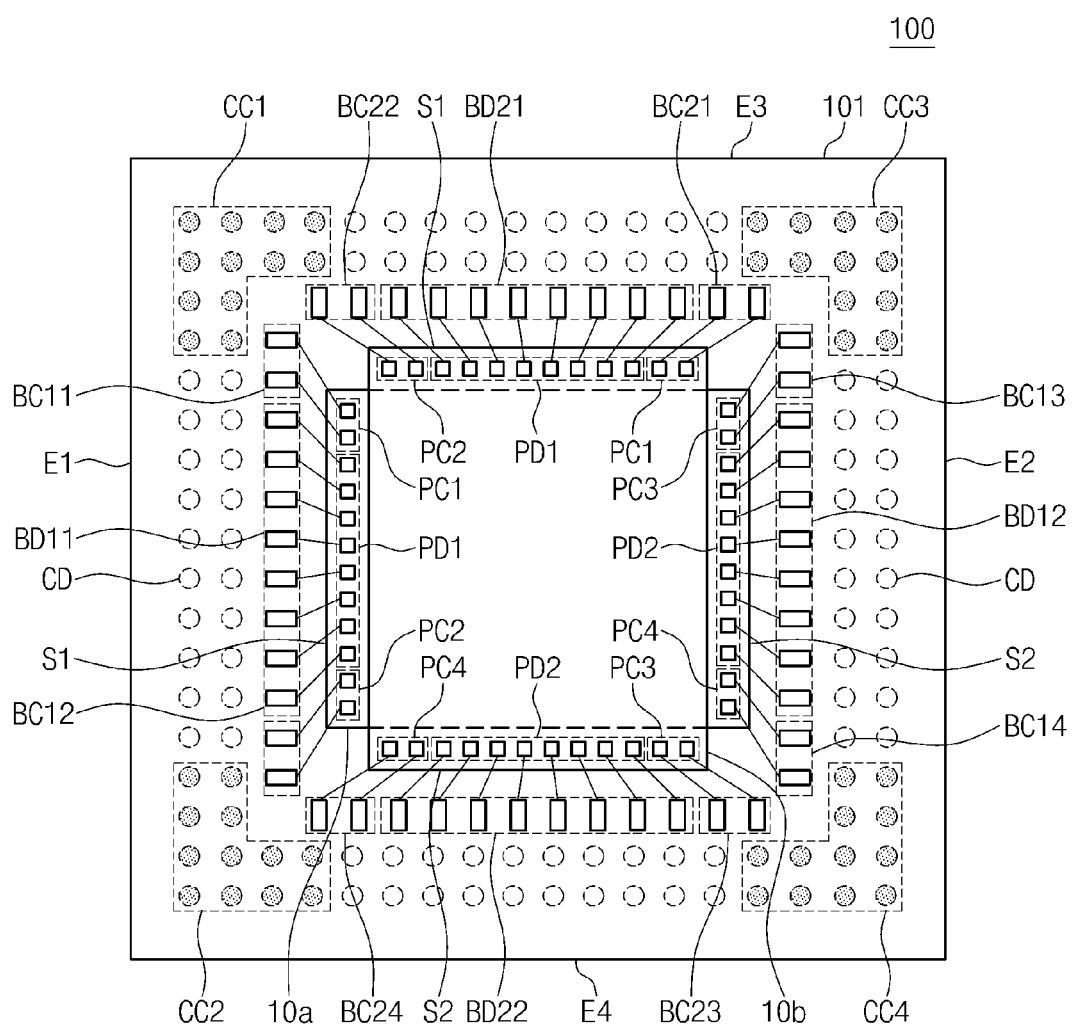
FIGS. 12 through 15 are plan views illustrating the first package according to still other example embodiments of the inventive concept.
Figure 13:
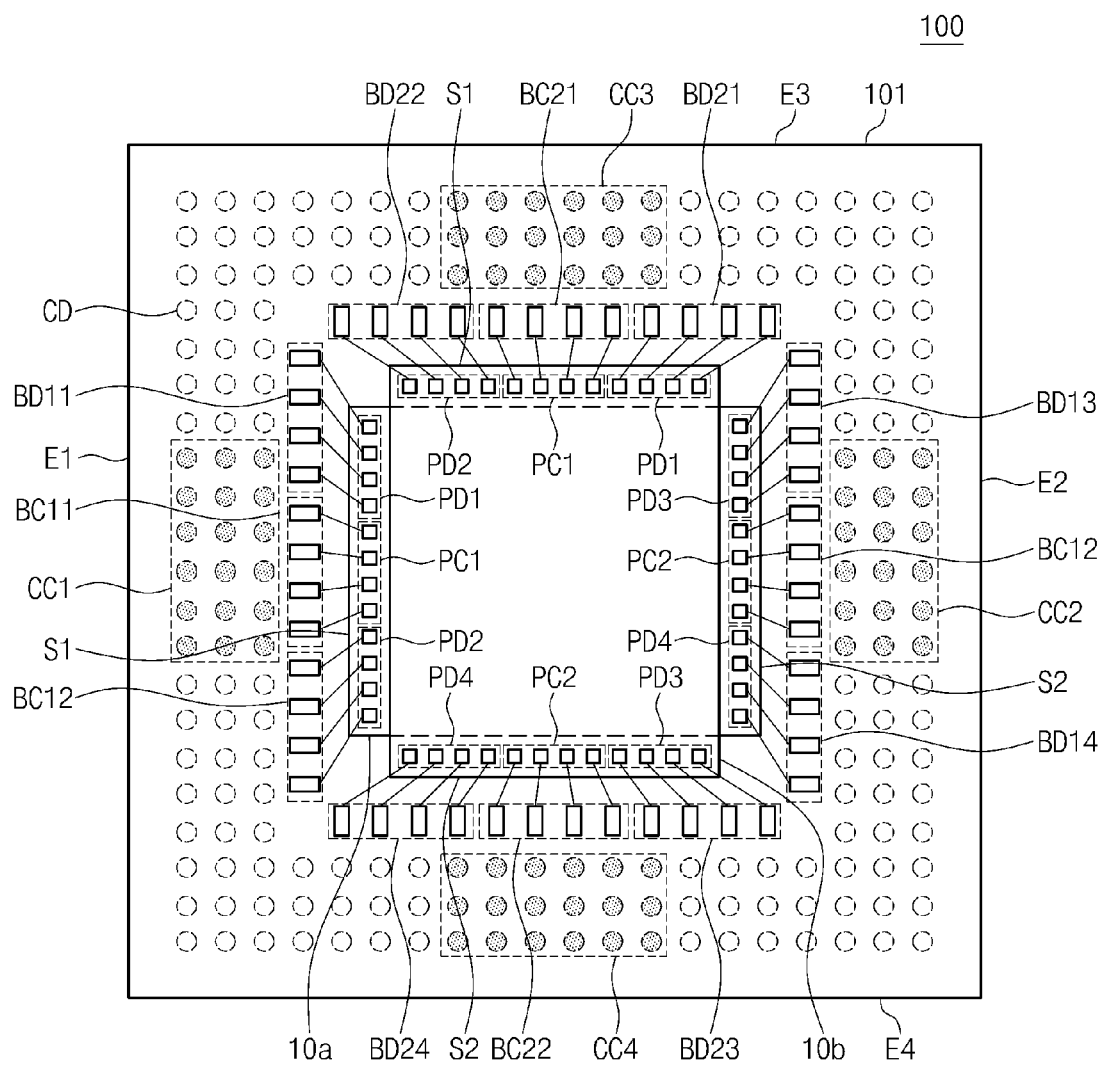

FIGS. 12 through 13 are plan views illustrating the first package according to still other example embodiments of the inventive concept.

Referring to FIG. 12, first and second memory chips 10a and 10b may be provided on the first package substrate 101. In example embodiments, the first and second memory chips 10a and 10b may include I/O pads having substantially the same arrangement as that previously described with reference to FIG. 6.

For example, the first CA bonding pads BC11, BC12, BC13, and BC14 may be arranged adjacent to the four corner portions of the first memory chip 10a to be connected to the command/address pads PC1, PC2, PC3, and PC4 of the first memory chip 10a. Similarly, the second CA bonding pads BC21, BC22, BC23, and BC24 may be arranged adjacent to the four corner portions of the second memory chip 10b to be connected to the command/address pads PC1, PC2, PC3, and PC4 of the second memory chip 10b.

Further, the CA connection pads CC1, CC2, CC3, and CC4 may be arranged near the four corners, respectively, of the first package substrate 101, such that they can be disposed closely or directly adjacent to the first and second CA bonding pads BC11, BC12, BC13, BC14, BC21, BC22, BC23, and BC24. In addition, the DQ connection pads CD may be arranged between the connection pads CC1, CC2, CC3, and CC4. For example, the DQ connection pads CD may be arranged adjacent to the first to fourth edges E1-E4, respectively, of the first package substrate 101.

Referring to FIG. 13, the first and second memory chips 10a and 10b may be provided on the first package substrate 101. In example embodiments, the first and second memory chips 10a and 10b may include I/O pads having substantially the same arrangement as that previously described with reference to FIG. 10. The CA connection pads CC1, CC2, CC3, CC4 and the DQ connection pads CD of the first package substrate 101 may be arranged in the form of triple lines surrounding the first and second memory chips 10a and 10b. With such embodiments of the present disclosure, it is possible to meet the increasing demand for high data processing speed and large memory capacity.

In some embodiments, the first and second side regions S1, S2 of the second memory chip 10b are substantially orthogonal to the first and second side regions S1, S2 of the first memory chip 10a.

Figure 14:
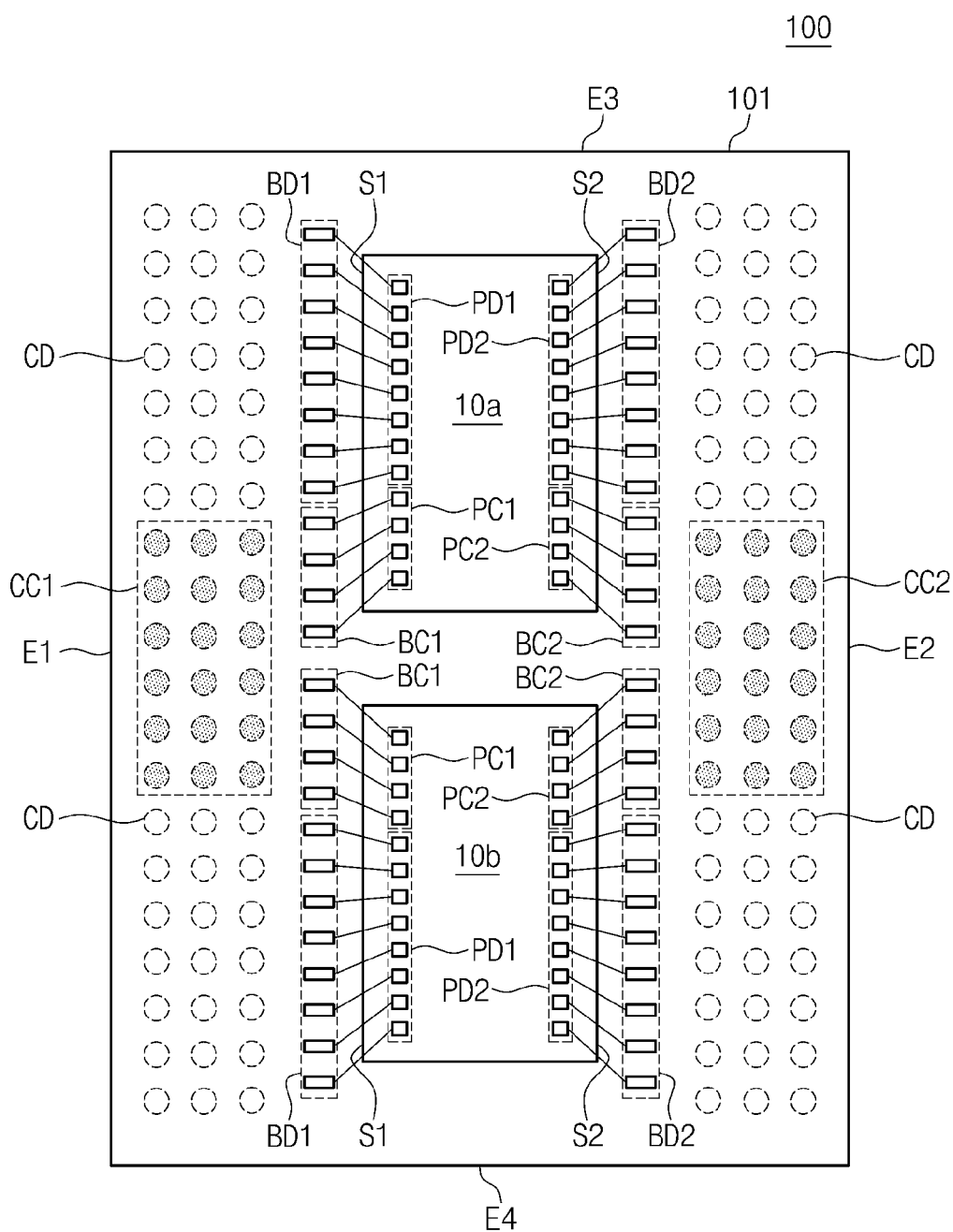
Figure 15:
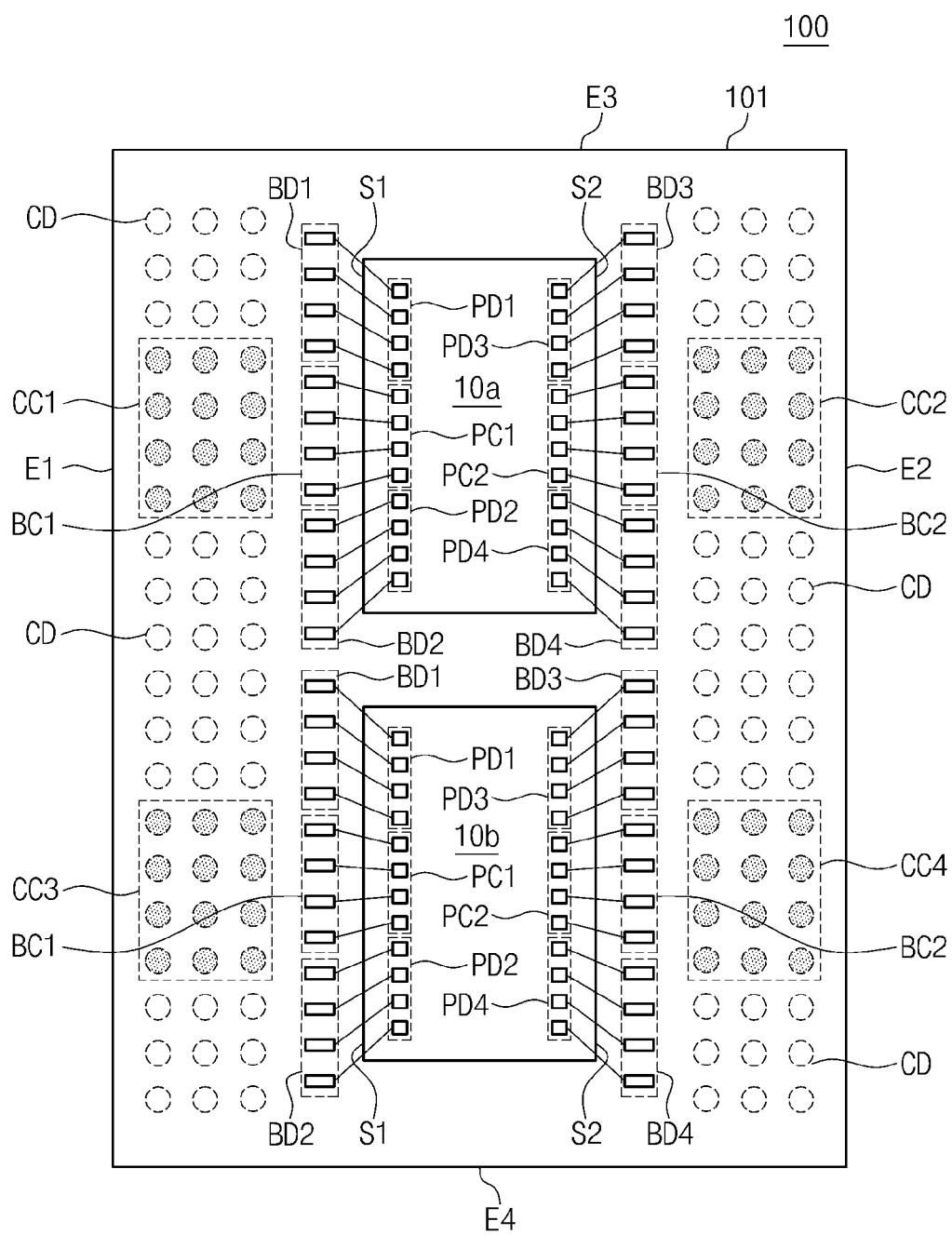

FIGS. 14 and 15 are plan views illustrating the first package according to some other example embodiments of the inventive concept.

Referring to FIG. 14, a plurality of the memory chips 10a and 10b may be mounted side-by-side on the top surface of the first package substrate 101. In example embodiments, the first and second memory chips 10a and 10b may be configured to have the same arrangement of the data and command/address pads as each other. In addition, each of the first and second memory chips 10a and 10b may include the first data pads PD1 and the first command/address pads PC1 disposed adjacent to the first side region S1 and the second data pads PD2 and the second command/address pads PC2 disposed adjacent to the second side region S2, as described with reference to FIG. 4.

On the top surface of the first package substrate 101, the first and second command/address pads PC1 and PC2 of the first memory chip 10a may be provided adjacent to the first and second command/address pads PC1 and PC2 of the second memory chip 10b.

The DQ and CA bonding pads BD1, BD2, BC1, and BC2 may be provided on the top surface of the first package substrate 101. For example, the DQ bonding pads BD1 and BD2 and the CA bonding pads BC1 and BC2 may be provided adjacent to the first and second side regions S1 and S2 of the first memory chip 10a, respectively, and be connected to the first memory chip 10a, for example, through the wire W. The DQ bonding pads BD1 and BD2 and the CA bonding pads BC1 and BC2 may be provided adjacent to the first and second side regions S1 and S2 of the second memory chip 10b, respectively, and be connected to the second memory chip 10b, for example, through the wire W.

Some (e.g., BD1 and BC1) of the DQ and CA bonding pads may be provided in a row adjacent to the first side region S1 of the first and second memory chips 10a and 10b, and the others (e.g., BD2 and BC2) may be provided in a row adjacent to the second side region S2 of the first and second memory chips 10a and 10b. In addition, the CA bonding pads BC1 and BC2 of the first and second memory chips 10a and 10b may be provided adjacent to each other. For example, the CA bonding pads BC1 and BC2 of the first and second memory chips 10a and 10b may be provided near the central portion of the first package substrate 101.

The DQ and CA connection pads CD, CC1, and CC2 may be provided on the bottom surface of the first package substrate 101. In example embodiments, the CA connection pads may include the first and second CA connection pads CC1 and CC2 arranged opposite to each other. For example, the DQ connection pads CD may be connected to the DQ bonding pads BD1 and BD2, for example, through the internal wire IC. The first and second CA connection pads CC1 and CC2 may be connected to the CA bonding pads BC1 and BC2, for example, through the internal wire IC. Some of the DQ and CA connection pads CD, CC1, and CC2 may be electrically connected to the first memory chip 10a, and the others may be electrically connected to the second memory chip 10b.

In some embodiments, the first CA connection pads CC1 may be disposed between the DQ connection pads CD adjacent to the first edge E1 of the first package substrate 101, and the second CA connection pads CC2 may be disposed between the DQ connection pads CD adjacent to the second edge E2 of the first package substrate 101. Accordingly, it is possible to reduce lengths of the internal wires IC that connect the DQ and CA connection pads CD, CC1, and CC2 to the DQ and CA bonding pads BD1, BD2, BC1, and BC2.

Referring to FIG. 15, the first and second memory chips 10a and 10b may be mounted side-by-side on the top surface of the first package substrate 101, and each of them may include the data pads PD1-PD4 and the command/address pads PC1 and PC2, as described with reference to FIG. 3. For example, each of the first and second memory chips 10a and 10b may include the first and second data pads PD1 and PD2 adjacent to the first side region S1, the first command/address pads PC1 provided between the first and second data pads PD1 and PD2, the third and fourth data pads PD3 and PD4 adjacent to the second side region S2, and the second command/address pads PC2 provided between the third and fourth data pads PD3 and PD4.

On the top surface of the first package substrate 101, the DQ and CA bonding pads BD1, BD2, and BC1 may be provided adjacent to the first side region S1 of each of the first and second memory chips 10a and 10b, and the DQ and CA bonding pads BD3, BD4, and BC2 may be provided adjacent to the second side region S2. The CA bonding pads BC1 and BC2 may be respectively disposed adjacent to the first and second command/address pads PC1 and PC2 of the first and second memory chips 10a and 10b. Accordingly, the CA bonding pads BC1 may be arranged between the DQ bonding pads BD1 and BD2 and adjacent to the first and second side regions S1 and S2 of the first and second memory chips 10a and 10b.

The DQ and CA connection pads CD, CC1, CC2, CC3, and CC4, which may be connected to the DQ and CA bonding pads BD1, BD2, BC1, BD3, BD4, and BC2 through the internal wire IC, may be provided on the bottom surface of the first package 100. In example embodiments, the CA connection pads may include oppositely arranged first and second CA connection pads CC1 and CC2, which may be electrically connected to the first memory chip 10a, and oppositely arranged third and fourth CA connection pads CC3 and CC4, which may be electrically connected to the second memory chip 10b. For example, the first and third CA connection pads CC1 and CC3 may be arranged adjacent to the first edge E1 of the first package substrate 101, and the second and fourth CA connection pads CC2 and CC4 may be arranged adjacent to the second edge E2 of the first package substrate. In addition, the DQ connection pads CD may be disposed between the first and third CA connection pads CC1 and CC3, and the DQ connection pads CD may be disposed between the second and fourth CA connection pads CC2 and CC4.

In some embodiments, the third CA connection pads CC3 may also be referred to as the first CA connection pads CC1 and the fourth connections may also be referred to as the second CA connection pads CC2. In this case, some of the DQ connection pads CD may be provided between the first CA connection pads CC1, and others of the DQ connection pads CD are provided between the second CA connection pads CC2.

FIGS. 16 through 20 are plan views illustrating logic chips according to various embodiments of the inventive concept.

Referring to FIGS. 16 through 20, a logic chip 20 may include first and second side regions S1 and S2 arranged opposite to each other and third and fourth side regions S3 and S4 that are substantially orthogonal to the first and second side regions S1 and S2 and arranged opposite to each other.

In example embodiments, the logic chip 20 may be, for example, a photoelectron device, a communication device, a digital signal processor, or a system-on-chip. For example, the semiconductor the logic chip 20 may be a digital baseband modem chip and/or an analog baseband modem chip.

The logic chip 20 may include data pads, which may receive or send data signals to the memory chip, command/address pads, which may receive or send command and address signals to the memory chip, and power and ground pads, which are applied with ground and power voltages, respectively. In other words, the logic chip 20 may include a plurality of data pads and a plurality of command/address pads, similar to the memory chip described with reference to FIGS. 3 through 6.

Figure 16:
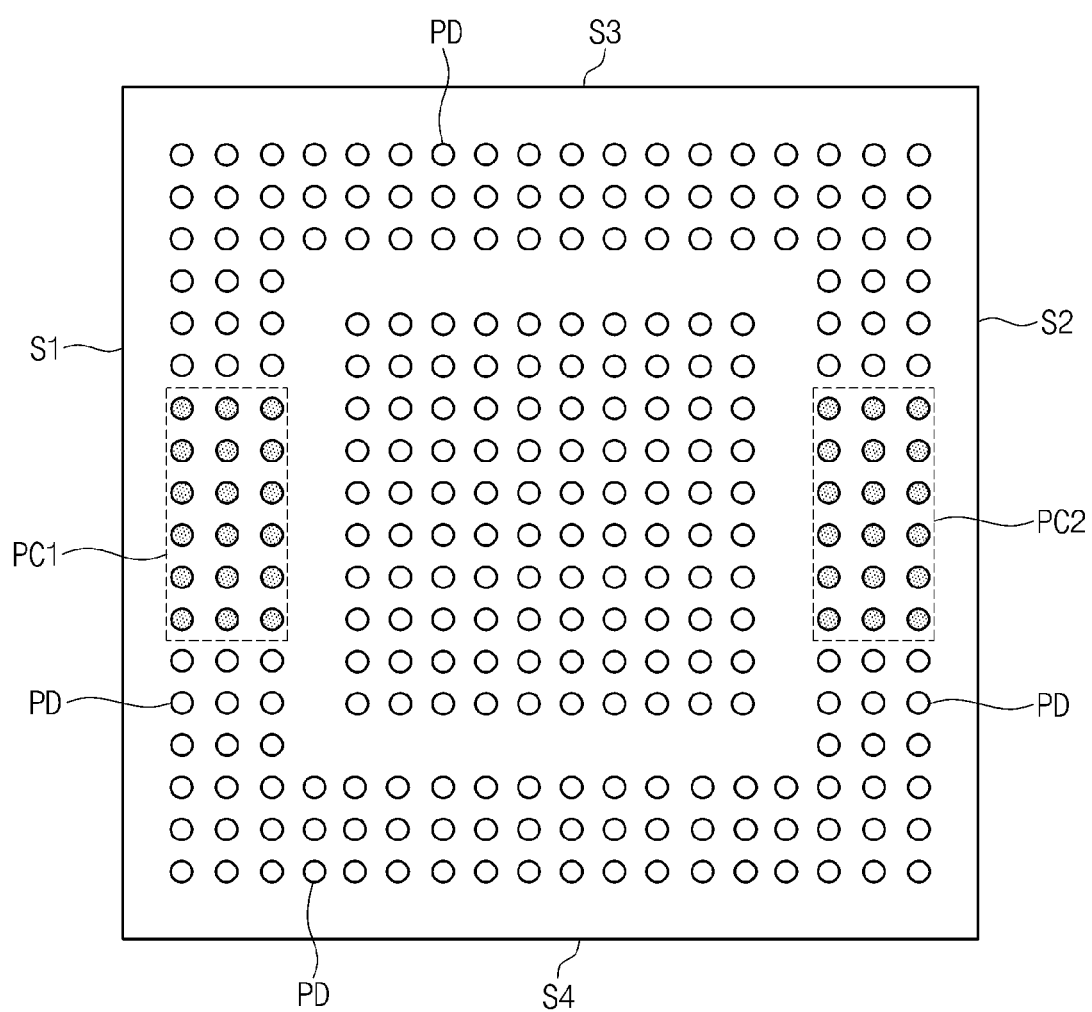
FIGS. 16 through 20 are plan views illustrating logic chips according to various embodiments of the inventive concept.
Figure 17:
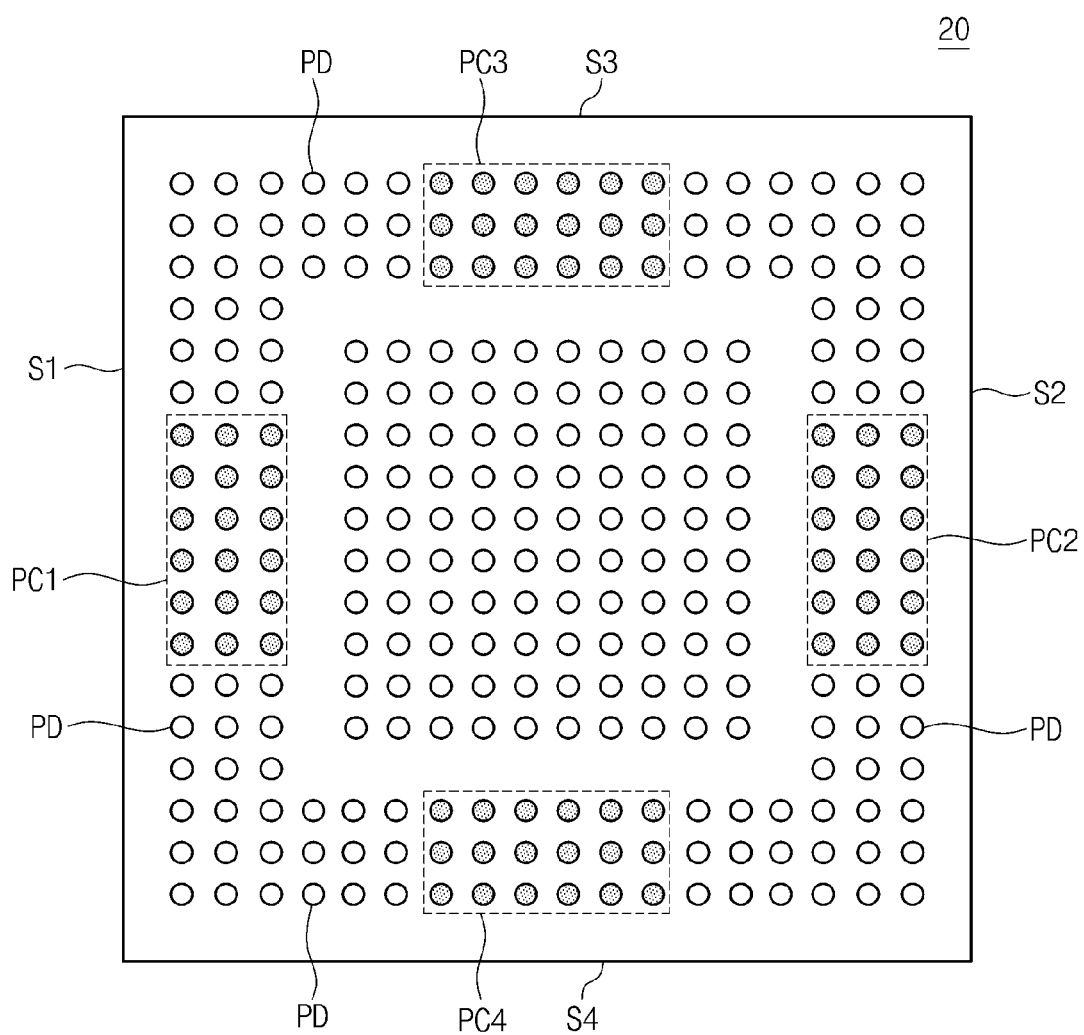
Figure 18:
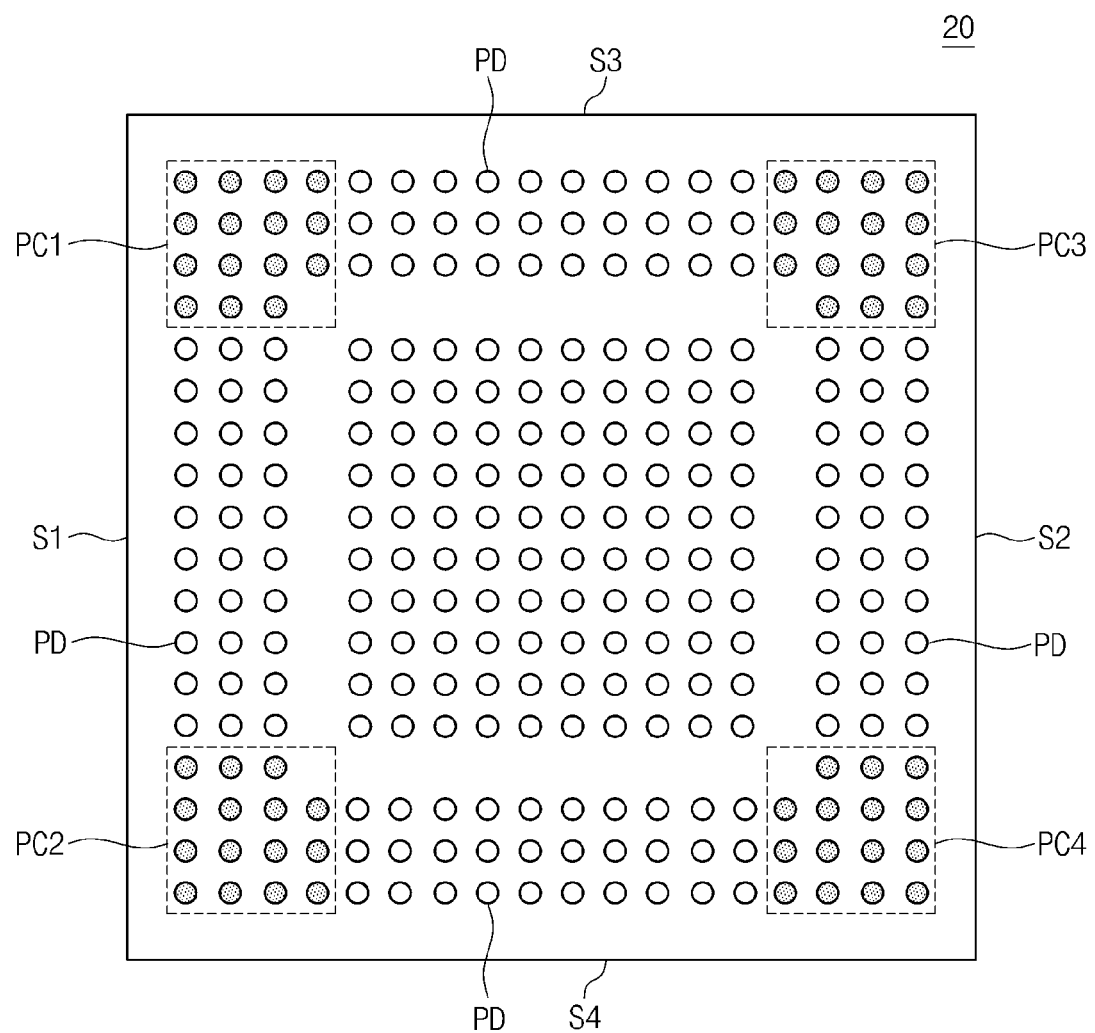

According to the embodiment shown in FIGS. 16 through 18, data pads PD and command/address pads PC1 and PC2 may be provided on the bottom surface of the logic chip 20. In the embodiment shown in FIGS. 16 through 18, the data pads PD and the command/address pads PC1 and PC2 may be bump pads, each of which includes a bump.

For example, as shown in FIG. 16, data pads PD and first command/address pads PC1 may be arranged adjacent to the first side region S1 of the logic chip 20, and data pads PD and second command/address pads PC2 may be disposed adjacent to the second side region S2 of the logic chip 20. The data pads PD may be disposed adjacent to third and fourth side regions S3 and S4.

According to the embodiment shown in FIG. 17, in the logic chip 20, the data pads PD and the first command/address pads PC1 may be arranged adjacent to the first side region S1, and the data pads PD and the second command/address pads PC2 may be disposed adjacent to the second side region S2 of the logic chip 20. The data pads PD and the third command/address pads PC3 may be arranged adjacent to the third side region S3, and the data pads PD and the third command/address pads PC4 may be arranged adjacent to the fourth side region S4 arranged opposite to the third side region S3.

As shown in FIG. 18, the logic chip 20 may include the first through fourth command/address pads PC1, PC2, PC3, and PC4, which may be provided near four corner portions thereof, respectively. The data pads PD may be arranged adjacent to the first to fourth side regions S1-S4, respectively, of the logic chip 20 and between the command/address pads PC1, PC2, PC3, and PC4.

Figure 19:
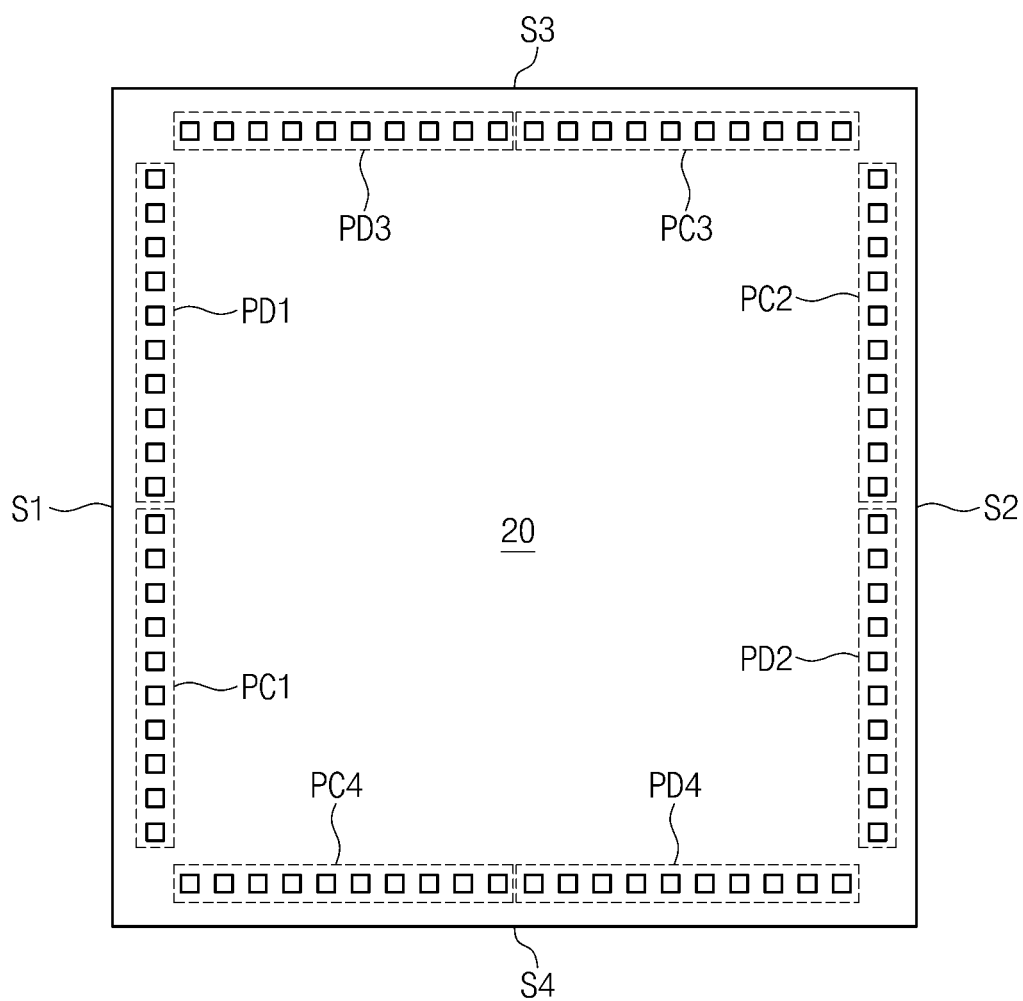
Figure 20:
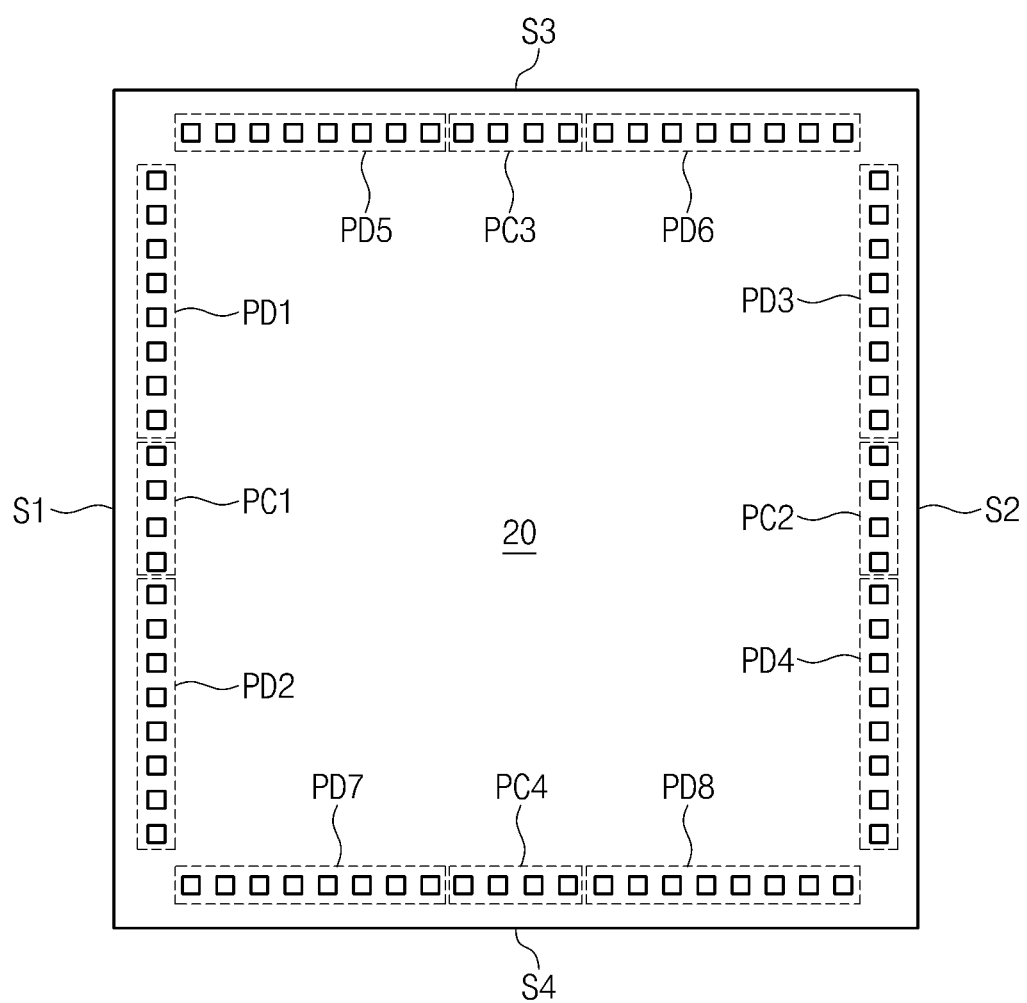

As shown in FIGS. 19 and 20, the logic chip 20 may include the data and command/address pads, which may be arranged adjacent to the first to fourth side regions S1-S4, respectively.

For example, according to the embodiment shown in FIG. 19, the first data pads PD1 and the first command/address pads PC1 may be disposed adjacent to the first side region S1 of the logic chip 20. The second data pads PD2 and the second command/address pads PC2 may be disposed adjacent to the second side region S2 of the logic chip 20. The third data pads PD3 and the third command/address pads PC3 may be disposed adjacent to the third side region S3 of the logic chip 20. The fourth data pads PD4 and the fourth command/address pads PC4 may be disposed adjacent to the fourth side region S4 of the logic chip 20. Here, the first data pads PD1 and the third data pads PD3 may be disposed adjacent to each other, and the second data pads PD2 and the fourth data pads PD4 may be disposed adjacent to each other. In addition, the first command/address pads PC1 and the fourth command/address pads PC4 may be disposed adjacent to each other, and the second command/address pads PC2 and the third command/address pads PC3 may be disposed adjacent to each other.

According to the embodiment shown in FIG. 20, first and second data pads PD1 and PD2 and the first command/address pads PC1 provided therebetween may be disposed adjacent to the first side region S1 of the logic chip 20. Third and fourth data pads PD3 and PD4 and the second command/address pads PC2 provided therebetween may be disposed adjacent to the second side region S2 of the logic chip 20. Fifth and sixth data pads PD5 and PD6 and the third command/address pads PC3 provided therebetween may be disposed adjacent to the third side region S3 of the logic chip 20. Seventh and eighth data pads PD7 and PD8 and the fourth command/address pads PC4 provided therebetween may be disposed adjacent to the fourth side region S4 of the logic chip 20. For example, in example embodiments, the data pads PD1-PD8 may be provided near four side regions, respectively, of the logic chip 20.

Figure 21:
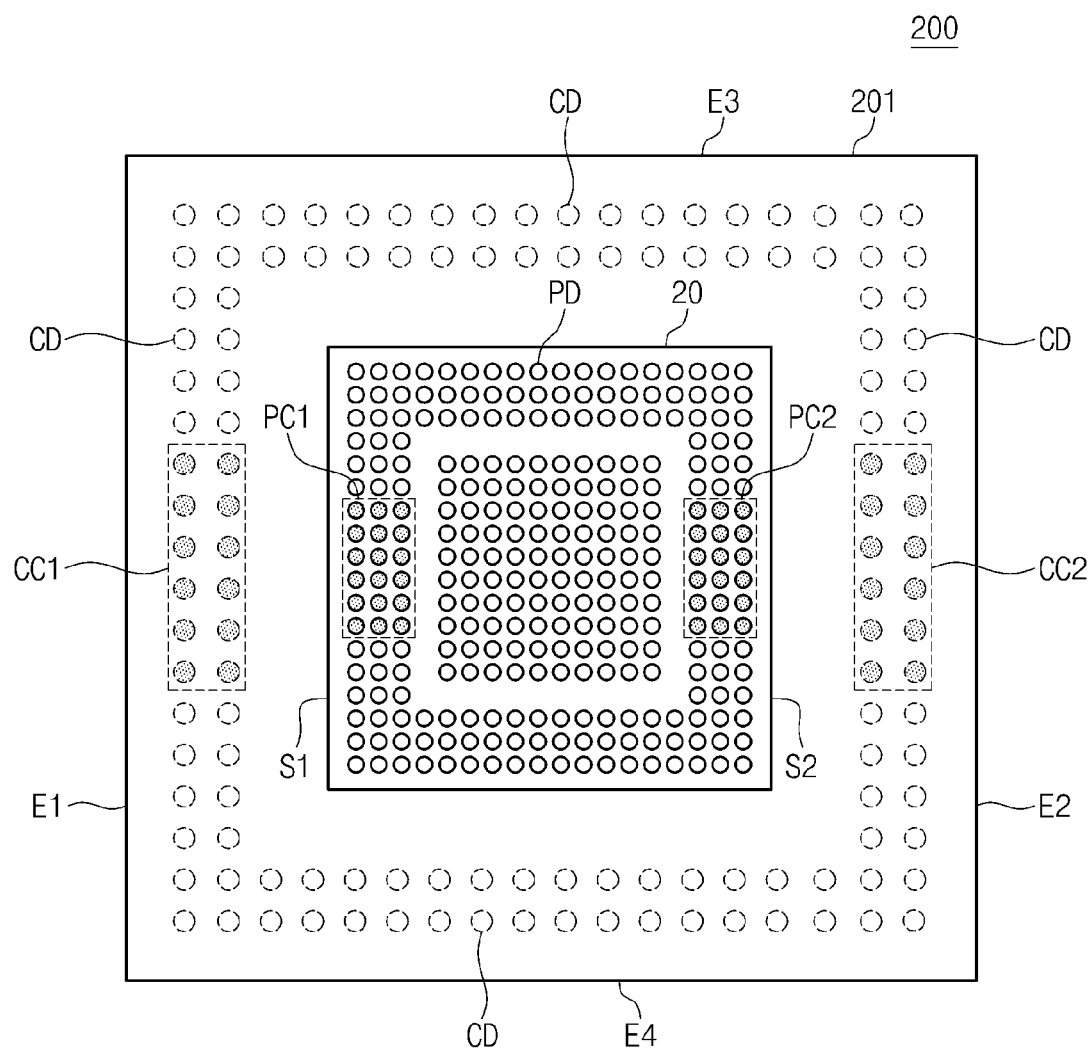
FIG. 21 is a plan view illustrating a second package according to example embodiments of the inventive concept.
Figure 22:
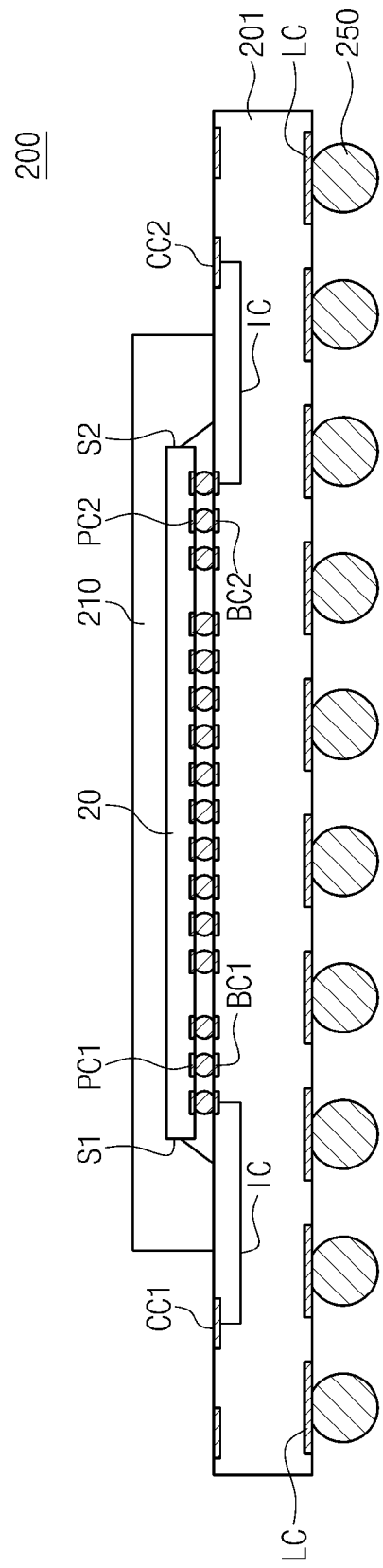
FIG. 22 is a cross-sectional view illustrating the second package according to example embodiments of the inventive concept.

FIG. 21 is a plan view illustrating a second package according to example embodiments of the inventive concept. FIG. 22 is a cross-sectional view illustrating the second package according to example embodiments of the inventive concept.

Referring to FIGS. 21 and 22, a second package 200 may include the logic chip 20 mounted on a top surface of a second package substrate 201. The logic chip 20 may be one of the logic chips described with reference to FIGS. 16 through 20. The logic chip 20 may be mounted on the second package substrate 201 using a wire bonding or flip-chip bonding technology. In example embodiments, the logic chip 20 may be mounted using a flip-chip bonding technology. In other words, the data pads PD and the command/address pads PC1 and PC2 provided on the logic chip 20 may be disposed to face the top surface of the second package substrate 201. Then, the I/O pads of the logic chip 20 may be attached to the bonding pads provided on the second package substrate 201 using conductive bumps.

The second package substrate 201 may be formed using one of various substrates, such as a printed circuit board, a flexible substrate, or a tape substrate. For example, the second package substrate 201 may be one of a flexible printed circuit board, a rigid printed circuit board, or combinations thereof, in which internal wires IC are provided.

The second package substrate 201 may include first to fourth edges or sides E1, E2, E3, and E4, where the first and second edges E1 and E2 may be opposite to each other and the third and fourth edges E3 and E4 may be opposite to each other.

The second package substrate 201 may include a top surface and a bottom surface and includes bonding pads BD (not shown), BC1, and BC2, upper connection pads CD, CC1, and CC2, lower connection pads LC, and internal wires IC. The bonding pads BC1 and BC2 and the upper connection pads CD, CC1, and CC2 may be arranged on the top surface of the second package substrate 201, and the lower connection pads LC may be arranged on the bottom surface of the second package substrate 201.

In some embodiments, the bonding pads BC1 and BC2 may be provided at a substantially central portion of the second package substrate 201, where the logic chip 20 is mounted, and be connected to the data pads PD and command/address pads PC1 and PC2 of the logic chip 20 via conductive bumps. For example, the bonding pads may include the DQ bonding pads BD connected to the data pads PD of the logic chip 20 and the CA bonding pads BC1 and BC2 connected to the command/address pads PC1 and PC2 of the logic chip 20. The CA bonding pads may include the first CA bonding pads BC1 and the second CA bonding pads BC2 that are provided to be opposite to each other.

The upper connection pads CD, CC1, and CC2 may be provided around the logic chip 20 and be electrically connected to the bonding pads BC1 and BC2 through the internal wires IC. The upper connection pads CD, CC1, and CC2 may be electrically connected to the lower connection pads LC through the internal wires IC. Outer connection terminals 250 may be attached to the lower connection pads LC, respectively.

For example, as shown in FIG. 21, the upper connection pads may include the DQ connection pads CD electrically connected to the data pads PD of the logic chip 20 and the CA connection pads CC1 and CC2 electrically connected to command/address pads PC1 and PC2 of the logic chip 20. For example, the CA connection pads may include the first CA connection pads CC1, which may be arranged adjacent to the first edge E1 of the second package substrate 201 and be connected to the first CA bonding pads BC1, and the second CA connection pads CC2, which may be arranged adjacent to the second edge E2 of the second package substrate 201 and be connected to the second CA bonding pads BC2. In addition, the first and second CA connection pads CC1 and CC2 may be disposed between the DQ connection pads CD.

Furthermore, the second package 200 may include a second mold layer 210 covering the logic chip 20. The second mold layer 110 may be provided between the second package substrate 201 and the logic chip 20 to fill a space therebetween. The second mold layer 210 may include an epoxy molding compound. The second mold layer 210 may be formed to expose the upper connection pads CD, CC1, and CC2 of the second package substrate 201. Alternatively, other encapsulant materials such as a ceramic casing may be used to cover the logic chip 20.

Figure 23:
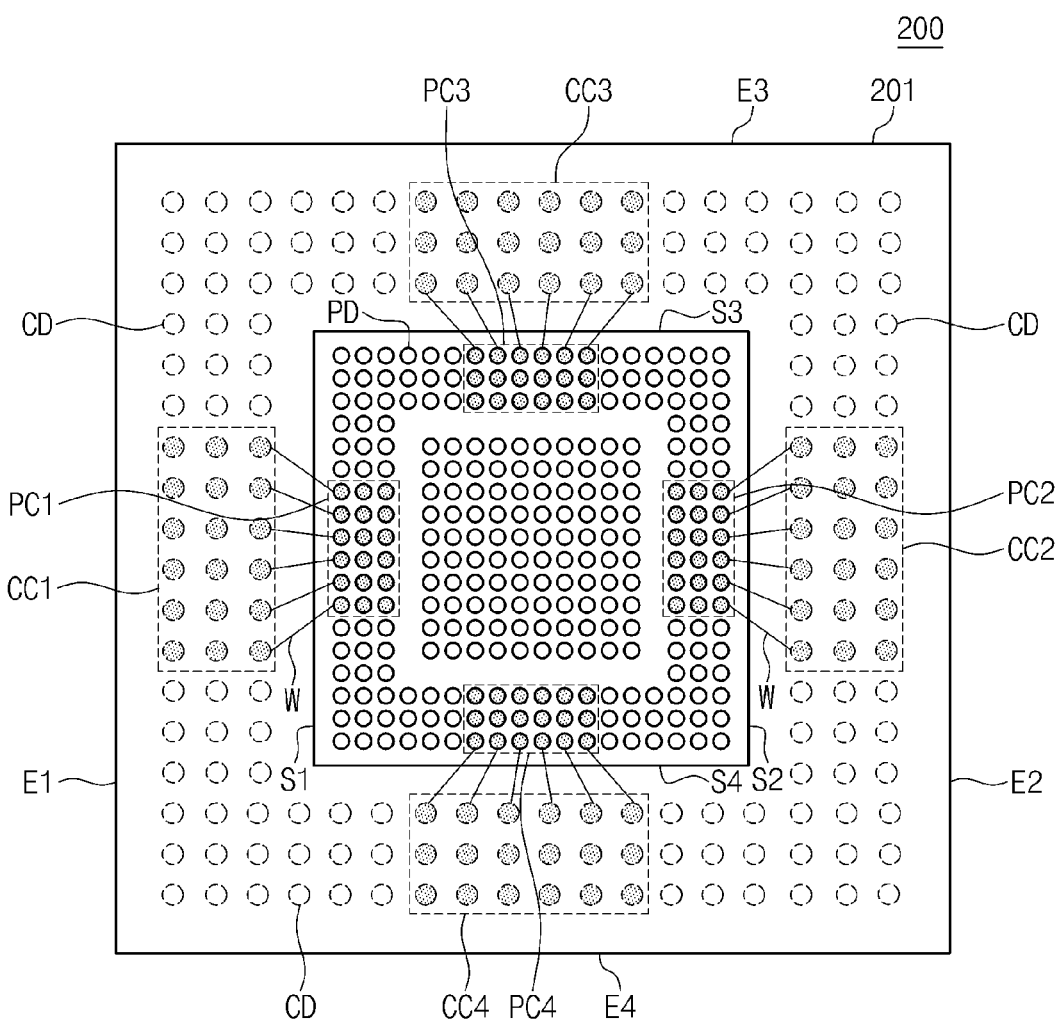
FIGS. 23 and 24 are plan views illustrating second packages according to other example embodiments of the inventive concept.
Figure 24:
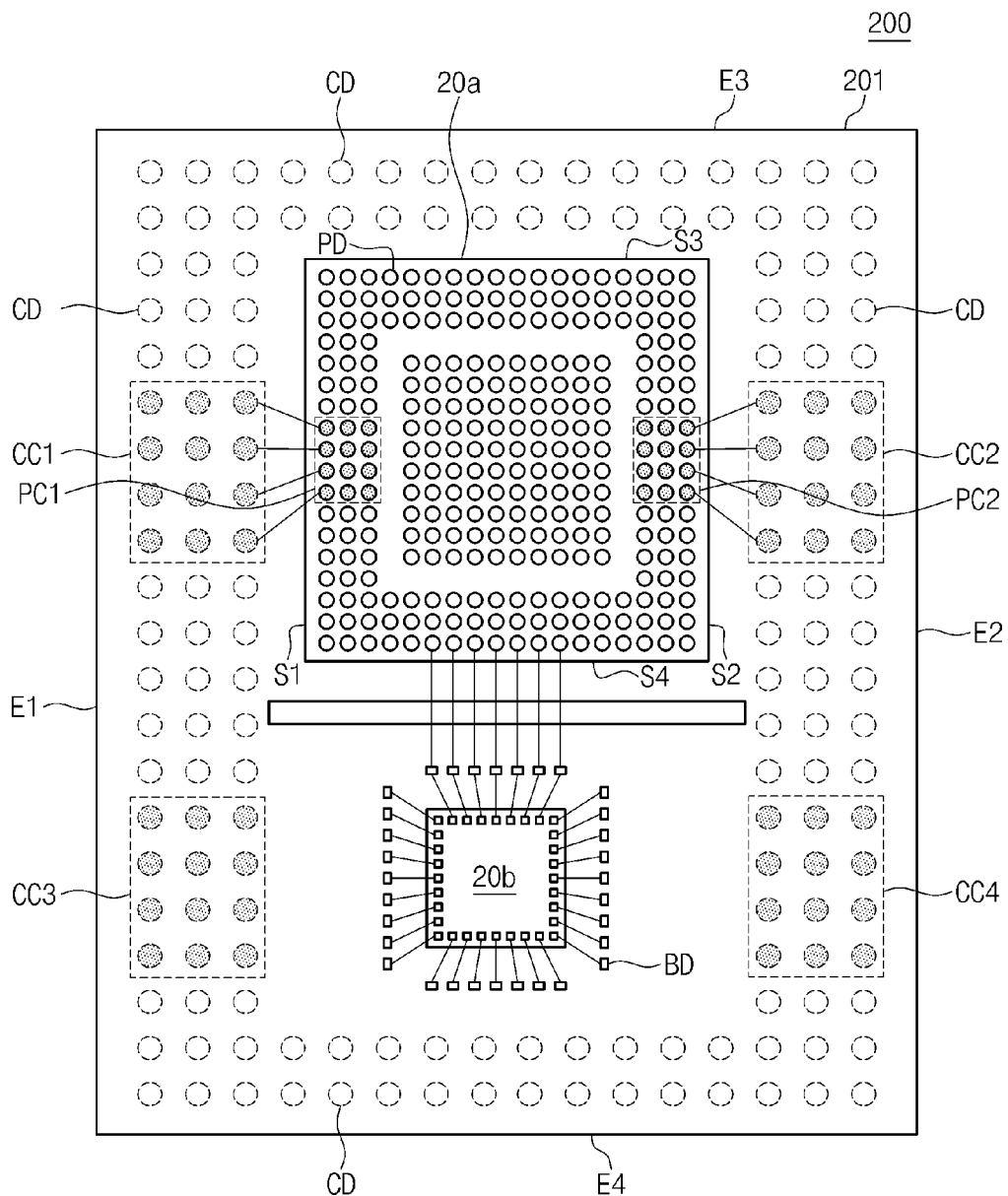

FIGS. 23 and 24 are plan views illustrating second packages according to some other example embodiments of the inventive concept.

Referring to FIG. 23, a second package substrate 201 may include the bonding pads, the upper connection pads CD, CC1, and CC2, the lower connection pads LC, and the internal wires IC, as described with reference to FIGS. 21 and 22. The bonding pads and the upper connection pads CD, CC1, and CC2 may be arranged on the top surface of the second package substrate 201, and the lower connection pads LC may be arranged on the bottom surface of the second package substrate 201. In some embodiments, the logic chip 20 may be mounted on a substantially central portion of the second package substrate 201 using, for example, a flip-chip bonding technology. In some embodiments, the logic chip 20 may include command/address pads PC1, PC2, PC3, and PC4, which may be provided adjacent to the first to fourth side regions S1, S2, S3, and S4, respectively.

The upper connection pads CD, CC1, CC2, CC3, and CC4 may be provided around the logic chip 20 and on the top surface of the second package substrate 201. The upper connection pads may include the DQ connection pads CD, which may be electrically connected to the data pads PD of the logic chip 20, and the CA connection pads CC1, CC2, CC3, and CC4, which may be electrically connected to the command/address pads PC1, PC2, PC3, and PC4 of the logic chip 20 through, for example, bonding wires W. In particular, the CA connection pads may include the first CA connection pads CC1, which may be provided adjacent to the first edge E1 of the second package substrate 201 and be connected to the first command/address pads PC1, the second CA connection pads CC2, which may be provided adjacent to the second edge E2 of the second package substrate 201 and be connected to the second command/address pads PC2, the third CA connection pads CC3, which may be provided adjacent to the third edge E3 of the second package substrate 201 and be connected to the third command/address pads PC3, and the fourth CA connection pads CC4, which may be provided adjacent to the fourth edge E4 of the second package substrate 201 and be connected to the fourth command/address pads PC4. In other words, the first to fourth CA connection pads CC1, CC2, CC3, and CC4 may be provided near the first to fourth edges E1-E4, respectively, of the second package substrate 201. In addition, the first to fourth CA connection pads CC1, CC2, CC3, and CC4 may be disposed between the DQ connection pads CD.

Referring to FIG. 24, first and second logic chips 20a and 20b may be mounted on the second package substrate 201. The first logic chip 20a may be mounted on the second package substrate 201 in a flip-chip bonding manner, while the second logic chip 20b may be mounted on the second package substrate 201 in a wire bonding manner. In addition, the first logic chip 20a and the second logic chip 20b may be connected to each other through the internal wires IC or bonding wires W as shown.

The second package substrate 201 may include the bonding pads, the upper connection pads CD, CC1, and CC2, the lower connection pads LC, and the internal wires IC. The bonding pads and upper connection pads CD, CC1, and CC2 may be arranged on the top surface of the second package substrate 201, and the lower connection pads may be arranged on the bottom surface of the second package substrate 201.

In example embodiments, the bonding pads and upper connection pads CD, CC1, and CC2 may be provided on the top surface of the second package substrate 201.

The bonding pads may be provided on a substantially central portion of the second package substrate 201, where the first and second logic chips 20a and 20b are provided. For example, the bonding pads may be provided at positions corresponding to the data pads PD and the command/address pads PC1 and PC2 of the first logic chip 20a. The bonding pads BD may be provided around the second logic chip 20b.

The upper connection pads CD, CC1, and CC2 may be provided around the first and second logic chips 20a and 20b. The upper connection pads may include the DQ connection pads CD, which may be connected to DQ bonding pads through the internal wire IC, and the CA connection pads CC1, CC2, CC3, and CC4, which may be connected to CA bonding pads through the internal wire IC.

The CA connection pads may include first and second CA connection pads CC1 and CC2, which may be electrically connected to the first logic chip 20a to be opposite to each other, and third and fourth CA connection pads CC3 and CC4, which may be electrically connected to the second logic chip 20b to be opposite to each other. For example, the first and third CA connection pads CC1 and CC3 may be arranged adjacent to the first edge E1 of the second package substrate 201, and the second and fourth CA connection pads CC2 and CC4 may be arranged adjacent to the second edge E2 of the second package substrate. In addition, the DQ connection pads CD may be disposed between the first and third CA connection pads CC1 and CC3, and the DQ connection pads CD may be disposed between the second and fourth CA connection pads CC2 and CC4.

Figure 25:
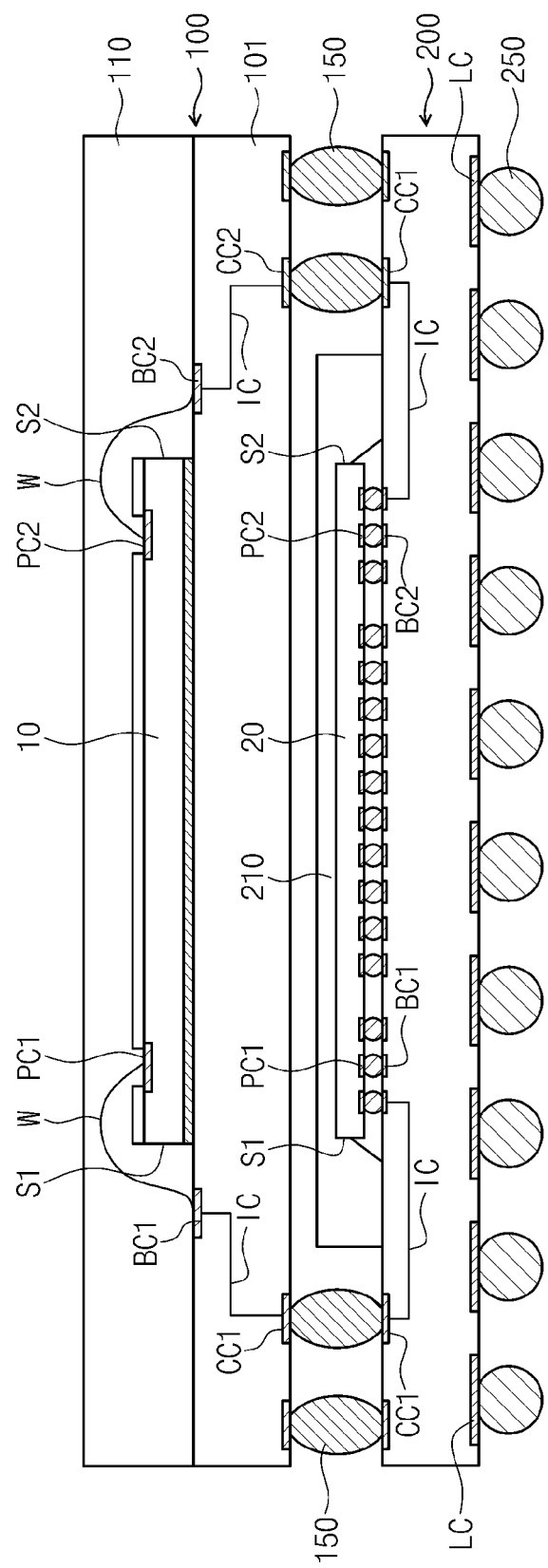
FIG. 25 is a cross-sectional view illustrating a stack-type semiconductor package according to example embodiments of the inventive concept.
Figure 26:
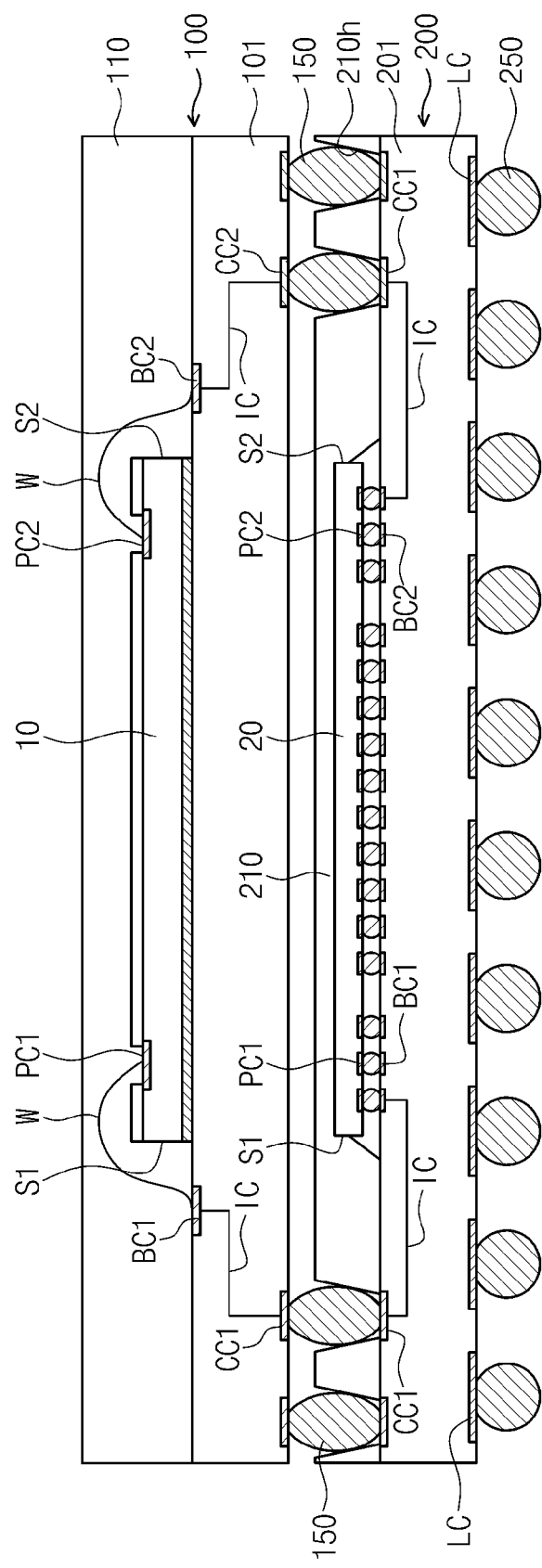
FIG. 26 is a cross-sectional view illustrating a modification of the stack-type semiconductor package shown in FIG. 25.

FIG. 25 is a cross-sectional view illustrating a stack-type semiconductor package according to example embodiments of the inventive concept. FIG. 26 is a cross-sectional view illustrating a modification of the stack-type semiconductor package shown in FIG. 25.

Referring to FIGS. 25 and 26, the first package 100 including the memory chip 10 may be stacked on the second package 200 including the logic chip 20. The first package 100 may include one of the memory chips 10 shown in FIGS. 3 through 6, and the second package 200 may include one of the logic chips 20 shown in FIGS. 16 through 20.

As described with reference to FIGS. 7 and 8, the first package 100 may include the CA connection pads CC1 and CC2 provided on the bottom surface of the first package substrate 101 to be opposite to each other. As described with reference to FIGS. 21 and 22, the second package 200 may include the CA connection pads CC1 and CC2 provided on the top surface of the second package substrate 201 to be opposite to each other.

The CA connection pads CC1 and CC2 of the first package 100 may be electrically connected to the CA connection pads CC1 and CC2 of the second package 200 through the outer connection terminal 150. In addition, the DQ connection pads (e.g., CD of FIG. 7) of the first package 100 may be electrically connected to the DQ connection pads (e.g., CD of FIG. 21) of the second package 200 through the outer connection terminal 150.

In some embodiments as shown in FIG. 26, the outer connection terminals 150 may be provided in holes 210h, respectively, which may be formed in the second mold layer 210. For example, the second mold layer 210 may be formed to cover the second package substrate 201 mounted with the logic chip 20 and have the holes 210h locally exposing the top surfaces of the upper connection pads CC1 and CC2. The outer connection terminals 150, which may be attached to the upper connection pads CC1 and CC2 of the first package substrate 101 may be inserted into the holes 210h of the second mold layer 210 and be electrically connected to the upper connection pads CC1 and CC2 of the second package 200.

Likewise, when the first and second packages 100 and 200 are stacked, the command/address pads PC1 and PC2 of the memory chip 10 may be arranged opposite to each other, and thus, the command/address pads PC1 and PC2 of the logic chip 20 may be provided adjacent to the corresponding command/address pads PC1 and PC2 of the memory chip 10, in plan view. In addition, the bonding pads BC1 and BC2 and the upper connection pads CC1 and CC2 on the first and second package substrates 101 and 201 may be provided adjacent to the command/address pads PC1 and PC2. Accordingly, it is possible to reduce a signal path length between the logic chip 20 and the memory chip 10 and consequently, increase an operation speed of the stack-type semiconductor package.

Figure 27:
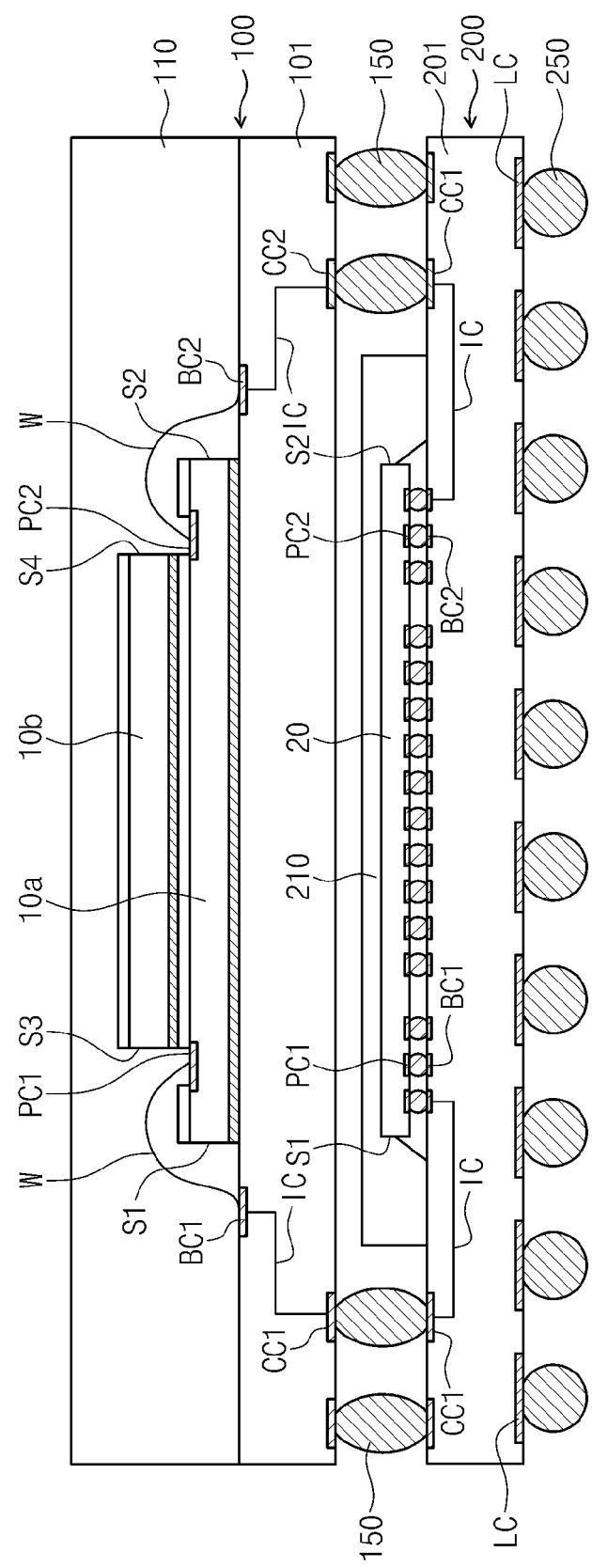
FIGS. 27 through 29 are cross-sectional views illustrating stack-type semiconductor package according to other example embodiments of the inventive concept.
Figure 28:
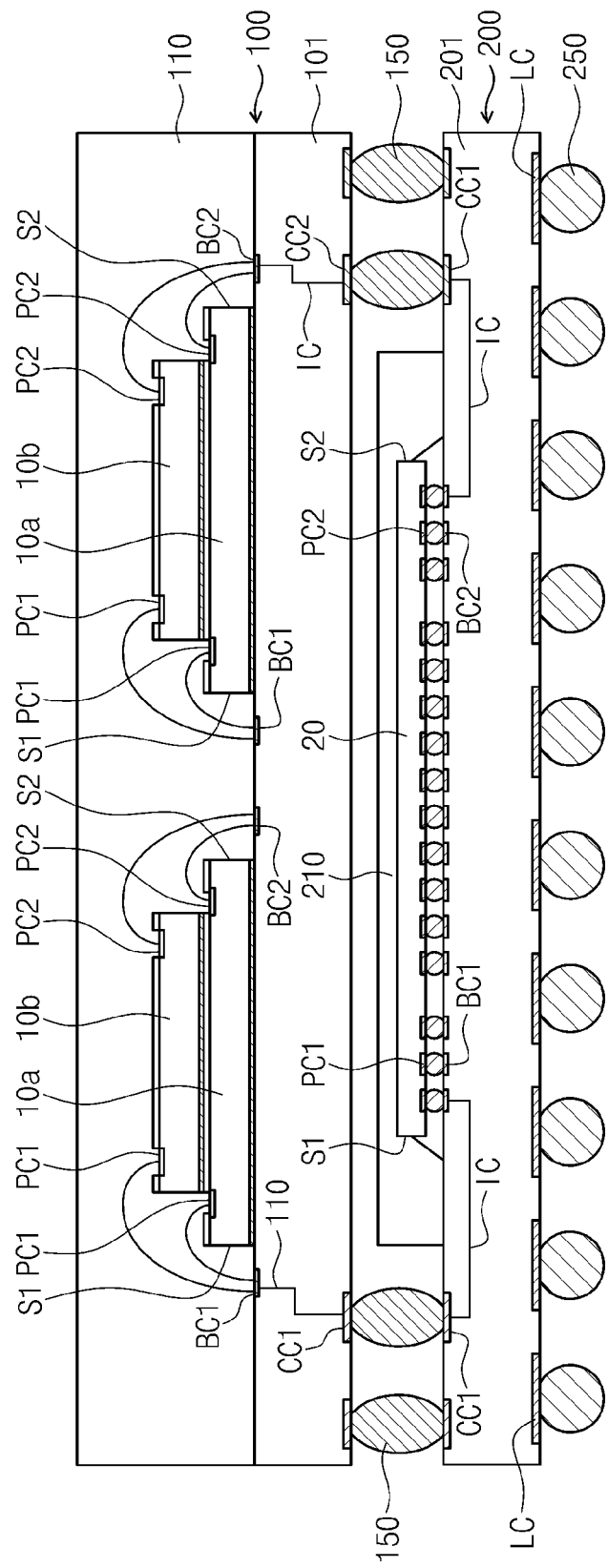
Figure 29:
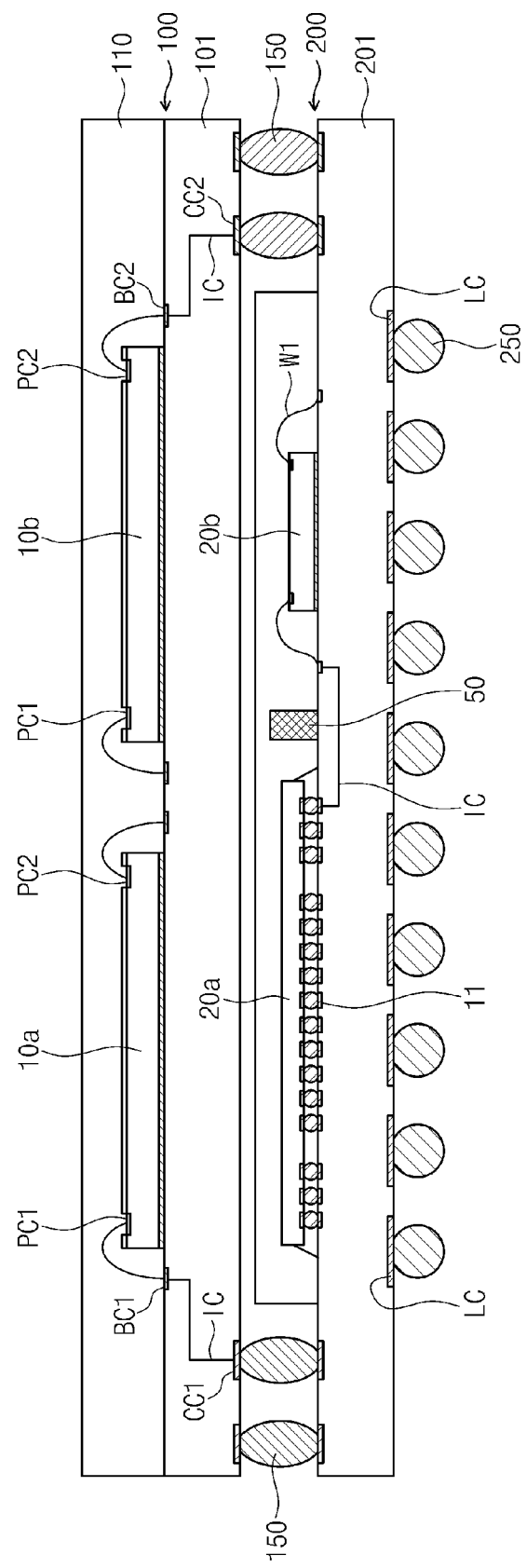

FIGS. 27 through 29 are cross-sectional views illustrating stack-type semiconductor package according to some other example embodiments of the inventive concept.

Referring to FIG. 27, the first package 100 may include a plurality of memory chips 10a and 10b, which may be stacked on the first package substrate 101. In example embodiments, the first package 100 may be configured to have the same technical features of the first package described with reference to FIG. 11. The second package 200 may include the logic chip 20 mounted on the second package substrate 201. Here, the logic chips may be one of the logic chips shown in FIGS. 16 through 20 or other similar logic chips.

The first package 100 may be stacked on the second package 200, and the outer connection terminals 150 may be disposed between the bottom surface of the first package substrate 101 and the top surface of the second package substrate 201. The first and second package substrates 101 and 201 may include the CA connection pads CC1 and CC2, where the CA connection pads CC1 and CC2 of the first package substrate 101 may be provided to face the corresponding CA connection pads CC1 and CC2 of the second package substrate 201. The outer connection terminals 150 may be attached to the CA connection pads CC1 and CC2 of the first and second package substrates 101 and 201. The memory chips 10a and 10b of the first package 100 may be electrically connected to the logic chips 20 of the second package 200 through the outer connection terminals 150.

Referring to FIG. 28, in the first package 100, a plurality of memory chips 10a may be arranged side-by-side on the first package substrate 101, and memory chips 10b may be stacked on the memory chips 10a, respectively. This may substantially increase a memory capacity of the first package 100.

In some embodiments, the stacked memory chips 10a and 10b may be interconnected using a through-silicon via (TSV). In this case, the memory chips 10a may be coupled to the first package substrate 101 using a flip chip bonding technology and the TSV may extends through the memory chips 10a and 10b.

Referring to FIG. 29, the first package 100 may include a plurality of memory chips 10a and 10b arranged side-by-side on the first package substrate 101, as described with reference to FIGS. 14 and 15. The second package 200 may include a plurality of logic chips 20a and 20b arranged side-by-side on the second package substrate 201, as described with reference to FIG. 24.

The first logic chip 20a may be mounted on the second package substrate 201 in a flip-chip bonding manner, and the second logic chip 20b may be mounted on the second package substrate 201 in a wire bonding manner. An underfill layer formed of a material such as a resin may be formed to fill a space between the first logic chip 20a and the second package substrate 201, and in example embodiments, a dam may be provided between the first and second logic chips 20a and 20b. The dam may be configured to substantially prevent the underfill layer from flowing into the second logic chip 20b, when the underfill layer is formed.

In some embodiments, the first logic chip 20a may be a digital baseband modem chip, and the second logic chip 20b may be an analog baseband modem chip. The second logic chip 20b may be configured to receive analog signals from the outside and send them to the first logic chip 20a. The first logic chip 20a may be configured to convert the analog signals, which may be transmitted from the second logic chip 20b, into digital signals, and then, send data signals and command/address signals to the memory chip 10.

The outer connection terminals 150 may be attached between the first and second package substrates 101 and 201 to connect the first package 100 electrically to the second package 200. In addition, the outer connection terminals 250 may be attached to the bottom surface of the second package substrate 201. In example embodiments, the stack-type semiconductor package may be connected to external electronic devices through the outer connection terminals 250.

In example embodiments, the first package 100 and the second package 200 may be stacked in such a way that the CA connection pads CC1 and CC2 of the first package 100 may be disposed adjacent to the CA connection pads CC1 and CC2 of the second package 200, in plan view. Accordingly, it is possible to substantially prevent signals from being delayed between the first and second packages 100 and 200. In other words, it is possible to improve performance of the stack-type semiconductor package.

Figure 30:
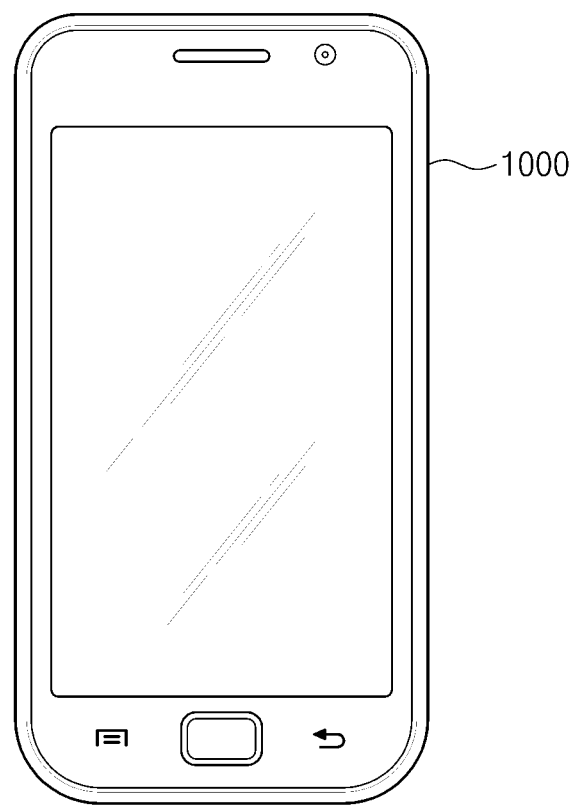
FIG. 30 is a diagram illustrating an example of electronic devices including the stack-type semiconductor package according to example embodiments of the inventive concept.
Figure 31:
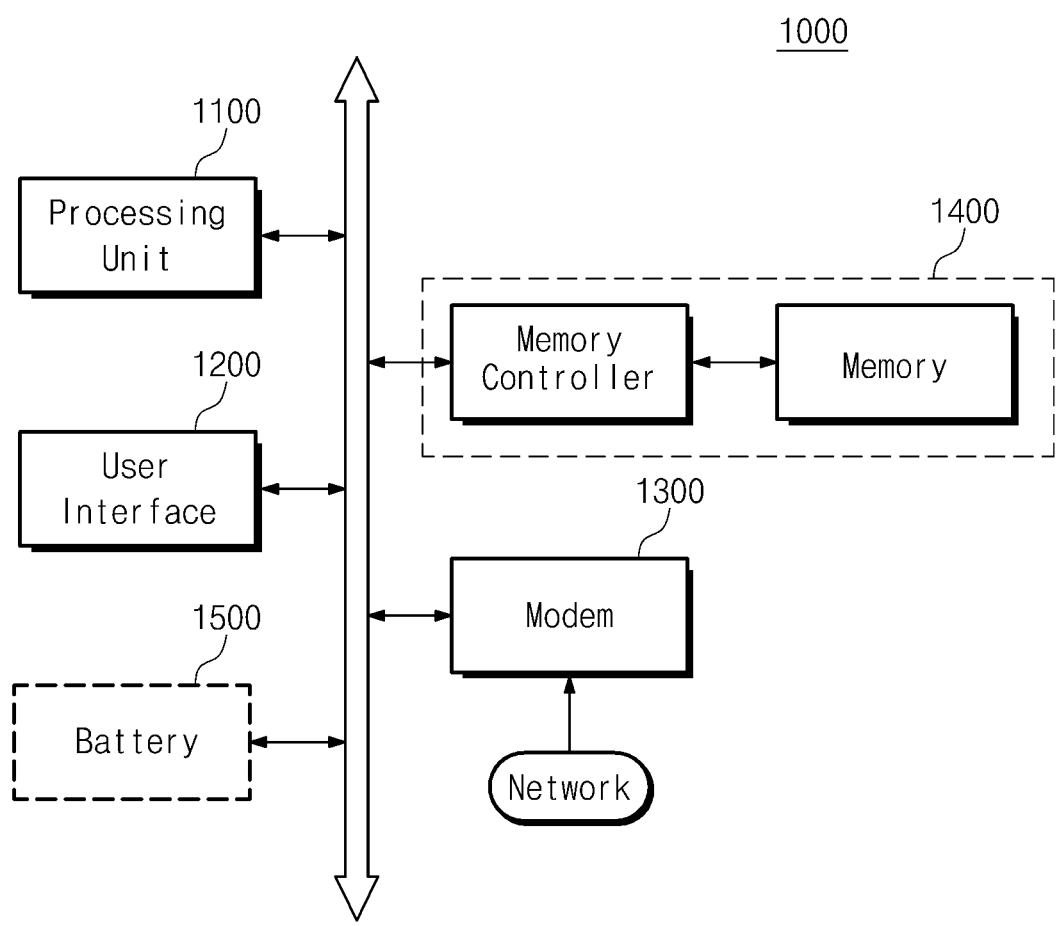
FIG. 31 is a block diagram illustrating an example of electronic devices including the stack-type semiconductor package according to example embodiments of the inventive concept.

FIG. 30 is a diagram illustrating an example of electronic devices including the stack-type semiconductor package according to example embodiments of the inventive concept. FIG. 31 is a block diagram illustrating an example of electronic devices including the stack-type semiconductor package according to example embodiments of the inventive concept.

Referring to FIG. 30, the stack-type semiconductor package according to example embodiments of the inventive concept may be used to realize a mobile phone 1000. Alternatively, the stack-type semiconductor package according to example embodiments of the inventive concept may be used to realize a personal digital assistant (PDA), a portable computer, a web tablet, a wireless phone, a digital music player, a memory card, or other electronic products, which may be configured to receive or transmit information data wirelessly.

Referring to FIG. 31, an electronic device 1000 according to example embodiments of the inventive concept may include a micro-processor 1100, a user interface 1200, a modem 1300 (e.g., a baseband chipset), and a stack-type semiconductor package 1400, which may be configured to have the same features as those previously described with reference to FIGS. 1 through 29.

If the electronic device 1000 is provided for a mobile application, the electronic device 1000 may further include a battery 1500. Further, although not shown, the electronic device 1000 may further include other electronic components, such as an application chipset and a Camera Image Processor (CIS), as will be obvious to skilled persons in the art.

According to example embodiments of the inventive concept, the semiconductor memory chip may include data pads and command/address pads disposed adjacent to a first side region and data pads and command/address pads disposed adjacent to a second side region facing the first side region. In other words, not only the data pads but also the command/address pads may be provided adjacent to each of two opposite side regions of the chip.

In addition, a first package with a memory chip and a second package with a logic chip may be stacked in such a way that the command/address pads of the logic chip are provided adjacent to the command/address pads of the memory chip, in plan view. Accordingly, even when the semiconductor package includes the memory and logic chips having different size and pin arrangement from each other, it is possible to minimize lengths of wires connecting the memory chip to the logic chip or lengths of signal paths between the chips). As a result, it is possible to improve routability of the package and a data processing speed between the memory chip and the logic chip.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a memory chip including first data pads and first command/address pads arranged adjacent to a first side region thereof and second data pads and second command/address pads arranged adjacent to a second side region thereof, arranged opposite the first side region; and
a package substrate including first CA connection pads and second CA connection pads,
wherein:
the memory chip is mounted on a top surface of the package substrate, the first CA connection pads are connected to the first command/address pads,
the second CA connection pads are arranged opposite the first CA connection pads and are connected to the second command/address pads, and
the package substrate comprises DQ connection pads connected to the first data pads and the second data pads, and wherein some of the DQ connection pads are provided adjacent to the first and second CA connection pads.

2. The semiconductor package of claim 1, wherein the first CA connection pads are provided adjacent to a first edge of the package substrate parallel to the first side region of the memory chip, and wherein the second CA connection pads are provided adjacent to a second edge of the package substrate opposite to the first edge.

3. The semiconductor package of claim 1, wherein others of the DQ connection pads are provided adjacent to third and fourth edges orthogonal to the first and second edges of the package substrate.

4. The semiconductor package of claim 1, wherein the memory chip comprises third data pads arranged adjacent to the first side region and fourth data pads arranged adjacent to the second side region,
the first command/address pads are provided between the first data pads and the third data pads, and
the second command/address pads are provided between the second data pads and the fourth data pads.

5. The semiconductor package of claim 1, further comprising an upper memory chip stacked on the memory chip,
wherein the upper memory chip comprises:
first data pads and first command/address pads provided adjacent to a first side region thereof; and
second data pads and second command/address pads provided adjacent to a second side region thereof facing the first side region, and
the first and second side regions of the upper memory chip are orthogonal to the first and second side regions of the memory chip.

6. The semiconductor package of claim 5, wherein the package substrate comprises third CA connection pads connected to the first command/address pads of the upper memory chip and fourth CA connection pads connected to the second command/address pads of the upper memory chip to be arranged opposite to the third CA connection pads.

7. The semiconductor package of claim 6, wherein the third CA connection pads are disposed adjacent to a third edge of the package substrate parallel to the first side region of the upper memory chip, and
the fourth CA connection pads are disposed adjacent to a fourth edge of the package substrate that is opposite to the third edge semiconductor package.

8. A semiconductor package comprising:
a first package substrate, the first package substrate including first to fourth edges; and a semiconductor memory chip mounted on the first package substrate, the semiconductor memory chip having a first side region and a second side region opposite to the first side region, the semiconductor memory chip having first data pads and first command/address pads adjacent to the first side region and second data pads and second command/address pads adjacent to the second side region, wherein the first package substrate includes first DQ bonding pads and first CA bonding pads adjacent to the first side region of the semiconductor memory chip and second DQ bonding pads and second CA bonding pads adjacent to the second side region of the semiconductor memory chip, wherein the first DQ bonding pads and the first CA bonding pads are respectively connected to the first data pads and the first command/address pads, and wherein the second DQ bonding pads and the second CA bonding pads are respectively connected to the second data pads and the second command/address pads.

9. The semiconductor package of claim 8, wherein the first package substrate includes: DQ connection pads on a bottom surface thereof, the DQ connection pads directly adjacent to the first and second DQ bonding pads, and first and second CA connection pads on the bottom surface thereof, the first and second CA connection pads directly adjacent to the first and second CA bonding pads.

10. The semiconductor package of claim 9, wherein the first and second CA connection pads are arranged adjacent to the first and second edges, respectively, of the first package substrate, and wherein the first and second CA connection pads are disposed opposite to each other.

11. The semiconductor package of claim 8, wherein the first data pads and the second data pads are arranged opposite to each other.

12. The semiconductor package of claim 8, wherein the first data pads and the second command/address pads are arranged opposite to each other.

13. The semiconductor package of claim 8, wherein the DQ connection pads are arranged near the third and fourth edges of the first package substrate.

14. The semiconductor package of claim 8, further comprising a second package substrate having a logic chip mounted thereon disposed below the first package substrate.

* * * * *